US011422209B2

(12) United States Patent
Xu et al.

(10) Patent No.: US 11,422,209 B2
(45) Date of Patent: Aug. 23, 2022

(54) MAGNETIC TUNNEL BARRIERS AND RELATED HETEROSTRUCTURE DEVICES AND METHODS

(71) Applicant: University of Washington, Seattle, WA (US)

(72) Inventors: Xiaodong Xu, Seattle, WA (US); Tiancheng Song, Seattle, WA (US); Xinghan Cai, Seattle, WA (US)

(73) Assignee: University of Washington, Seattle, WA (US)

( * ) Notice: Subject to any disclaimer, the term of this patent is extended or adjusted under 35 U.S.C. 154(b) by 162 days.

(21) Appl. No.: 16/755,539

(22) PCT Filed: Oct. 15, 2018

(86) PCT No.: PCT/US2018/055942
§ 371 (c)(1),
(2) Date: Apr. 10, 2020

(87) PCT Pub. No.: WO2019/075481
PCT Pub. Date: Apr. 18, 2019

(65) Prior Publication Data
US 2020/0264248 A1    Aug. 20, 2020

Related U.S. Application Data

(60) Provisional application No. 62/572,310, filed on Oct. 13, 2017.

(51) Int. Cl.
*H01L 43/02*    (2006.01)
*G01R 33/09*    (2006.01)
(Continued)

(52) U.S. Cl.
CPC .......... *G01R 33/093* (2013.01); *G11C 11/161* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; G11C 11/161; G01R 33/093
(Continued)

(56) References Cited

U.S. PATENT DOCUMENTS

| 10,879,464 B2* | 12/2020 | Krogstrup Jeppesen .................... H01L 43/10 |
| 2006/0006334 A1* | 1/2006 | Kadono ................. B82Y 10/00 250/338.2 |
| 2017/0098716 A1 | 4/2017 | Li et al. |

OTHER PUBLICATIONS

Song, T., et al., "Giant tunneling magnetoresistance in spin-filter van der Waals heterostructures," Science 360, 2018, 1214-1218.
(Continued)

*Primary Examiner* — Jami Valentine Miller
(74) *Attorney, Agent, or Firm* — Christensen O'Connor Johnson Kindness PLLC

(57) ABSTRACT

Disclosed herein are devices, systems, and methods that provide improved tunneling magnetoresistance (TMR) through the use of innovative device structures and heterostructure layers therein. Particularly, two or more magnetic layers form a heterostructure core of the switching device, with control of current passing through the heterostructure determined by an applied magnetic field that modifies the magnetization of the heterostructure from a ground magnetic state that is layered antiferromagnetic.

20 Claims, 17 Drawing Sheets

(51) Int. Cl.
*G11C 11/16* (2006.01)
*H01L 43/08* (2006.01)
*H01L 43/10* (2006.01)

(58) Field of Classification Search
USPC .......................................................... 257/421
See application file for complete search history.

(56) References Cited

OTHER PUBLICATIONS

Song, T., et al., "Voltage Control of a van der Waals Spin-Filter Magnetic Tunnel Junction," Nano Letters, 2019, 19, 915-920.
Worledge, D.C., et al., "Magnetoresistive double spin filter tunnel junction," J. Appl. Phys., 2000, 88, 5277-5279.
Miao, G.X., et al., "Magnetoresistance in Double Spin Filter Tunnel Junctions with Nonmagnetic Electrodes and its Unconventional Bias Dependence," Phys. Rev. Lett., 2009, 102, 076601, 4 pages.
Baibich, M.N., et al., "Giant Magnetoresistance of (001) Fe/(001) Cr Magnetic Superlattices," Phy. Rev. Lett., 1988, 61, 2472-2475.
Binasch, G., et al., "Enhanced magnetoresistance in layered magnetic structures with antiferromagnetic interlayer exchange," Phys. Rev., 1989, B 39, 4828-4830.
Dieny, B., et al., "Giant magnetoresistance in soft ferromagnetic multilayers," Phys. Rev., 1991, B 43, 1297-1300.
Julliere, M., "Tunneling between Ferromagnetic Films," Phys. Lett., 1975, A 54, 225-226.
Moodera, J.S., et al., "Large Magnetoresistance at Room Temperature in Ferromagnetic Thin Film Tunnel Junctions," 1995, Phys. Rev. Lett., 74, 3273-3276.
Miyazaki, T., et al., "Giant magnetic tunneling effect in Fe/Al2O3/Fe junction", J. Magn. Magn. Mater., 1995, 139, L231-L234.
Yuasa, S., et al., "Giant room-temperature magnetoresistance in single-crystal Fe/MgO/Fe magnetic tunnel junctions", Nat. Mater. 2004, 868-871.
Parkin, S.S.P., et al., "Giant tunnelling magnetoresistance at room temperature with MgO (100) tunnel barriers," Nat. Mater. 2004, 3, 862-867.
Ikeda, S. et al., "Tunnel magnetoresistance of 604% at 300 K by suppression of Ta diffusion in CoFeB/MgO/CoFeB pseudo-spin-valves annealed at high temperature," Appl. Phys. Lett., 2008, 93, 082508, 4 pages.
Geim, A., et al., "Van der Waals Heterostructures," Nature 499 [online], 2013 <https://arxiv.org/ftp/arxiv/papers/1307/1307.6718.pdf> [retrieved Nov. 21, 2018], pp. 419-425.
Huang, B., et al., "Layer-Dependent Ferromagnetism in a van der Waals Crystal Down to the Monolayer Limit," Nature International Journal of Science 546 [online], Jun. 2017, <https://www.nature.com/articles/nature22391> [retrieved Nov. 8, 2018], pp. 270-273.
International Search Report and Written Opinion dated Dec. 4, 2018, issued in corresponding International Application No. PCT/US2018/55942, filed Oct. 15, 2018, 10 pages.
Song, T., et al., "Giant Tunneling Magnetoresistance in Spin-Filter van der Waals Heterostructures," Science vol. 360, No. 6394 [online], Jan. 2018, <https://arxiv.org/ftp/arxiv/papers/1801/1801.08679.pdf> [retrieved Nov. 21, 2018], entire document.
Zhong, D., et al., "Van der Waals Engineering of of Ferromagnetic Semiconductor Heterostructures for Spin and Valleytronics," Science Advances vol. 3, No. 5, e1603113 [online], May 31, 2017, <https://arxiv.org/ftp/arxiv/papers/1704/1704.00841.pdf> [retrieved Nov. 21, 2018], entire document.

* cited by examiner

MAGNETIC TUNNEL BARRIERS AND RELATED HETEROSTRUCTURE DEVICES AND METHODS

CROSS-REFERENCE TO RELATED APPLICATION

This application claims the benefit of U.S. Patent Application No. 62/572,310, filed on Oct. 13, 2017, the disclosure of which is hereby incorporated by reference in its entirety.

STATEMENT OF GOVERNMENT LICENSE RIGHTS

This invention was made with government support under Grant No. DMR-1708419, awarded by the National Science Foundation. The government has certain rights in the invention.

BACKGROUND

Conventional Magnetic Tunnel Junctions (MTJs) are composed of two ferromagnetic electrodes separated by a non-magnetic tunnel barrier, where giant tunneling magnetoresistance (TMR) is realized when the magnetization of the two ferromagnets are switched between parallel and anti-parallel alignment. In conventional MTJ, a specific tunnel barrier is needed, thereby limiting the selection of magnetic materials. These requirements limit the state-of-the-art TMR to be about 1000% at low temperature. Improvement of the TMR of conventional MTJ present a strong challenge without a present solution. From a practical perspective, it is also a challenge to make atomically thin and high-density MTJ devices, due to the traditional materials used. In addition, conventional MTJ can only have on and off states, without multi-bit storage functionality.

In view of these limitations of conventional MTJ devices and materials, improved MTJ devices with increased TMR and other functionalities are desired, although difficult to achieve.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect a system for controlling electric current across a magnetic tunnel junction is provided. In one embodiment, the system includes:

a magnetic tunnel barrier comprising a layered structure having a first magnetic layer with a first magnetic vector and a second magnetic layer with a second magnetic vector that is opposite to the first magnetic vector;

a first electrode that is not magnetic and is electrically connected to the first magnetic layer; and a second electrode that is not magnetic and is electrically connected to the second magnetic layer;

wherein the magnetic tunnel barrier permits significantly larger tunneling current to tunnel from the first electrode to the second electrode only when the first magnetic vector and the second magnetic vector are aligned.

In another aspect, a method of controlling an electric current across a magnetic tunnel barrier in a system of the type disclosed herein is provided, the layered heterostructure of the magnetic tunnel barrier having a characteristic magnetic structure, and the method comprising:

applying a voltage to the layered heterostructure of the magnetic tunnel barrier, between the first electrode and the second electrode;

applying a magnetic field to the layered heterostructure; and modulating the magnetic field to control an electric current flowing from the first electrode to the second electrode.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

(FIG. 1A) Schematic of magnetic states in bilayer $CrI_3$. Left: layered-antiferromagnetic state which suppresses the tunneling current at zero magnetic field; middle and right: fully spin-polarized states with out-of-plane and in-plane magnetizations, which do not suppress it. (FIG. 1B) Schematic of 2D spin-filter magnetic tunnel junction (sf-MTJ), with bilayer $CrI_3$ functioning as the spin-filter sandwiched between few-layer graphene contacts. (FIG. 1C) Tunneling current of a bilayer $CrI_3$ sf-MTJ at selected magnetic fields. Top inset: optical microscope image of the device (scale bar 5 µm). The dashed line shows the position of the bilayer $CrI_3$. Bottom: schematic of the magnetic configuration for each $I_t$-V curve. FIG. 1D schematically illustrates a representative system for controlling devices as disclosed herein.

(FIG. 2A) Tunneling current as a function of out-of-plane magnetic field ($\mu_0 H_\perp$) at a selected bias voltage (−290 mV). Curves corresponds to decreasing or increasing magnetic field. The junction area is about 0.75 µm². (FIG. 2B) Reflective magnetic circular dichroism (RMCD) of the same device at zero bias. Insets show the corresponding magnetic states. (FIG. 2C) Extracted sf-TMR ratio as a function of bias based on the $I_t$-V curves in FIG. 1C. (FIG. 2D) Tunneling current as a function of in-plane magnetic field ($\mu_0 H_\parallel$) at a selected bias voltage (−290 mV) with simulations (dashed lines). Insets show the corresponding magnetic states.

(FIG. 3A) Tunneling current as a function of out-of-plane magnetic field ($\mu_0 H_\perp$) at a selected bias voltage (235 mV). The junction area is about 0.06 µm². (FIG. 3B) RMCD of the same device at zero bias showing antiferromagnetic interlayer coupling. Insets show the corresponding magnetic states. (FIG. 3C) sf-TMR ratio calculated from the $I_t$-V data shown in the inset.

(FIG. 4A) Tunneling current as a function of out-of-plane magnetic field ($\mu_0 H_\perp$) at a selected bias voltage (300 mV), and (FIG. 4B) the corresponding RMCD of the same device at zero bias. Insets show the corresponding magnetic states. The junction area is about 2.2 µm². (FIG. 4C) Calculated sf-TMR ratio as a function of bias based on the $I_t$-V curves in the inset. (FIG. 4D) Schematic of possible magnetic states corresponding to the intermediate plateaus in (FIG. 4A) and (FIG. 4B). Lines show the current-blocking interfaces. (FIG.

4E) and (FIG. 4F) Tunneling current and RMCD from another four-layer $CrI_3$ sf-MTJ. The junction area is about 1.3 µm².

Figure 5A:
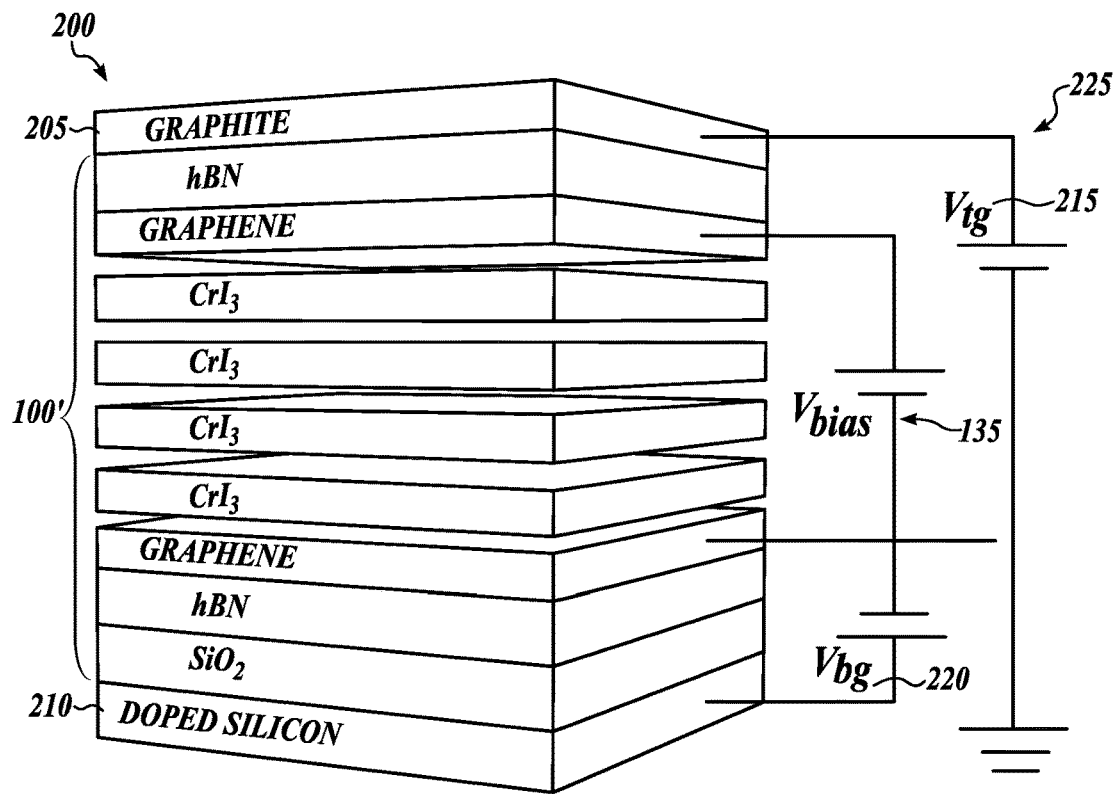
Figure 5B:
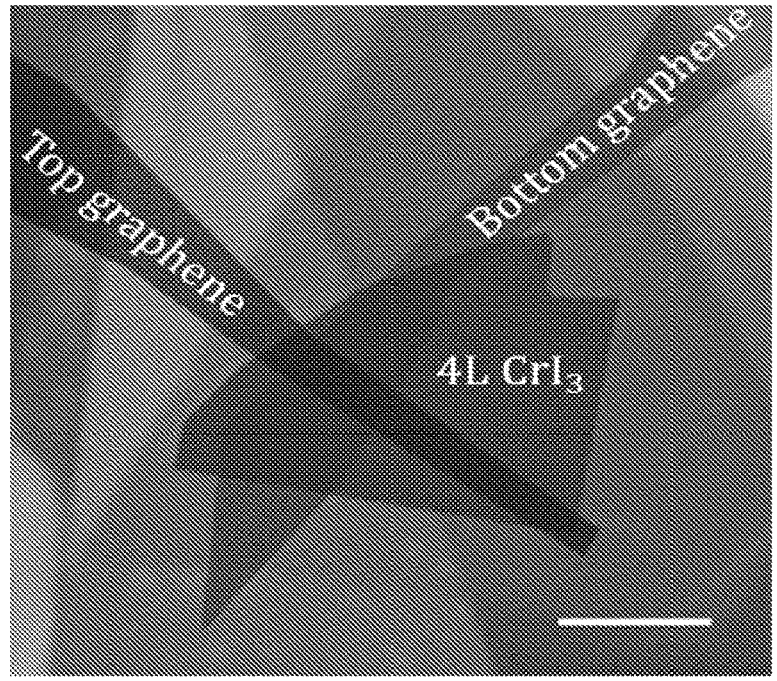
Figure 5C:
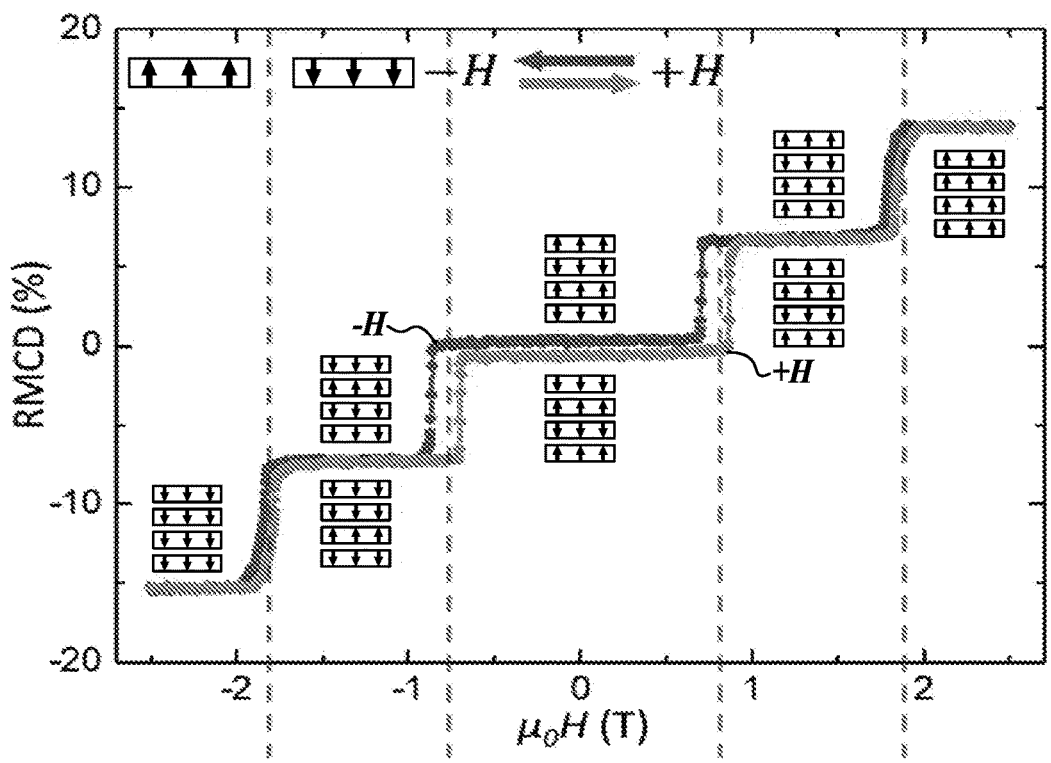
Figure 5D:
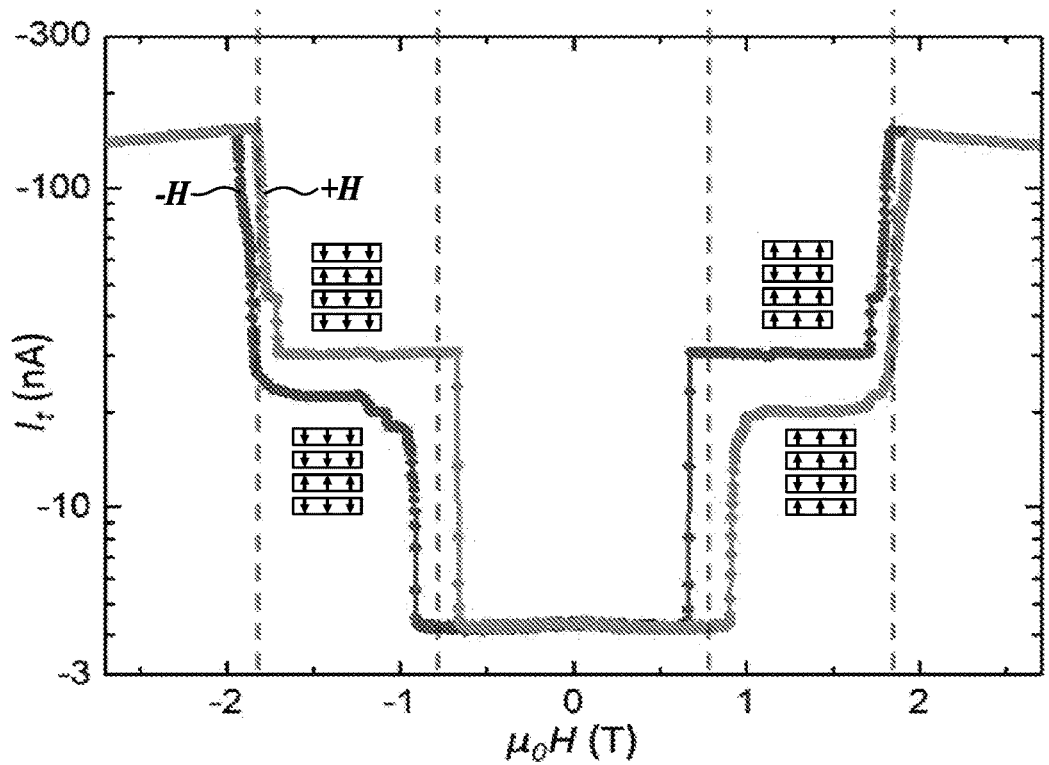

FIGS. 5A-5D. Magnetic states in four-layer $CrI_3$ spin-filter magnetic tunnel junction (sf-MTJ). FIG. 5A, Schematic of a four-layer $CrI_3$ sf-MTJ device including two monolayer graphene contacts and top and bottom gates. FIG. 5B, False-color optical micrograph of device 1 (scale bar 5 µm). FIG. 5C, Reflective magnetic circular dichroism (RMCD) signal as a function of out-of-plane magnetic field ($\mu_0H$) from device 1. The curves correspond to sweeping the magnetic field up and down. Insets show the corresponding magnetic states. Blocks denote the out-of-plane magnetization of individual layers pointing up and down. FIG. 5D, Tunneling current ($I_t$) of the same device at representative bias and gate voltages (V=−240 mV, $V_{tg}$=0 V and $V_{bg}$=0 V).

Figure 6A:
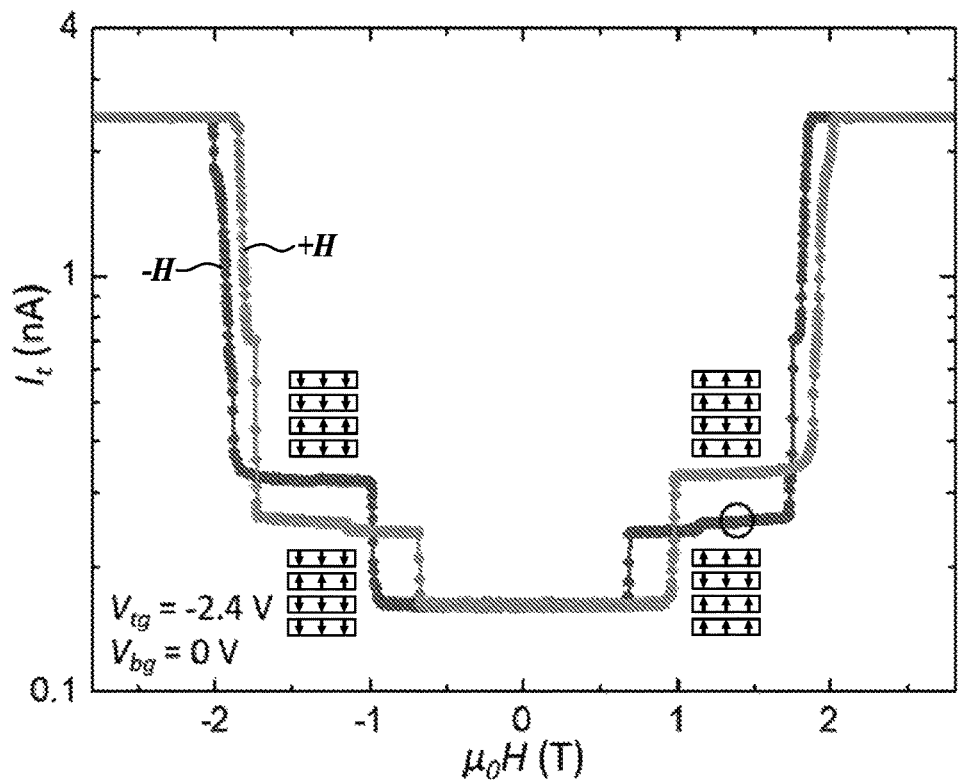
Figure 6B:
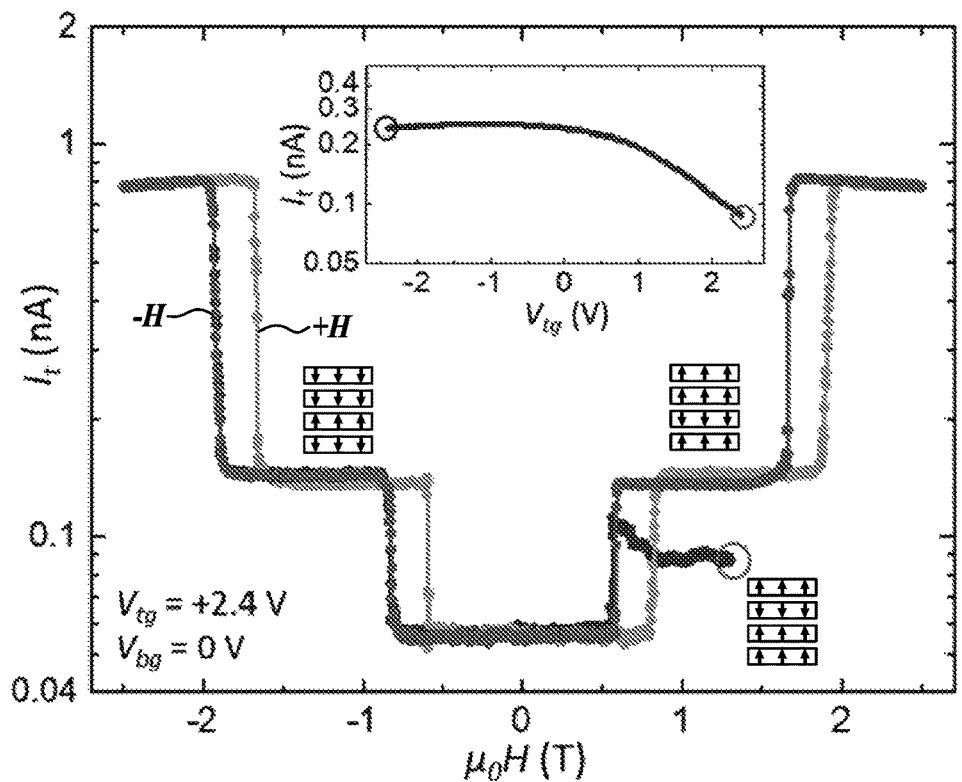
Figure 6C:
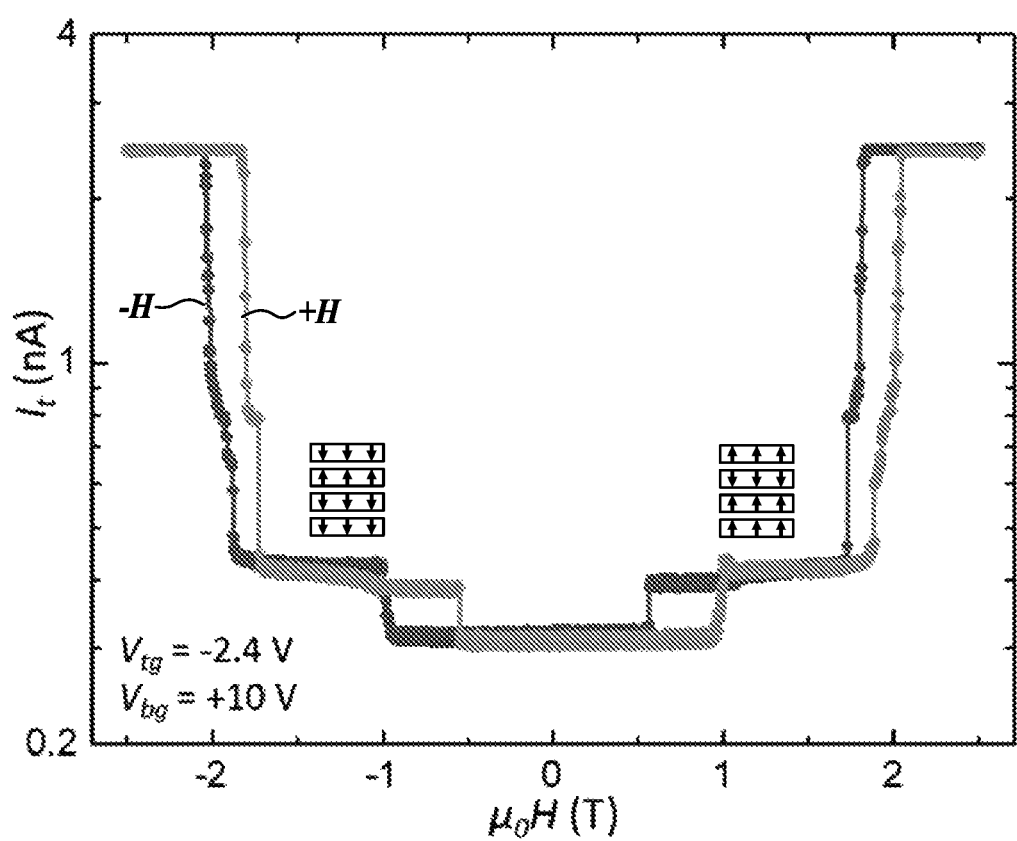

FIGS. 6A-6C. Electric control of bistable magnetic states. FIGS. 6A, 6B, 6C, $I_t$ (V=+80 mV) as a function of $\mu_0H$ at three representative gate voltages with identified magnetic states as shown in the insets. The curves correspond to sweeping the magnetic field up and down. The inset of 6B shows $I_t$ as sweeping $V_{tg}$ from −2.4 to +2.4 V. The open circles indicate the starting and end points, corresponding to the circles in FIG. 6A (initial state) and 6B (final state). Subsequently, $\mu_0H$ sweeps down and $I_t$ is monitored, as shown by the curve in the main panel of FIG. 6B.

Figure 7A:
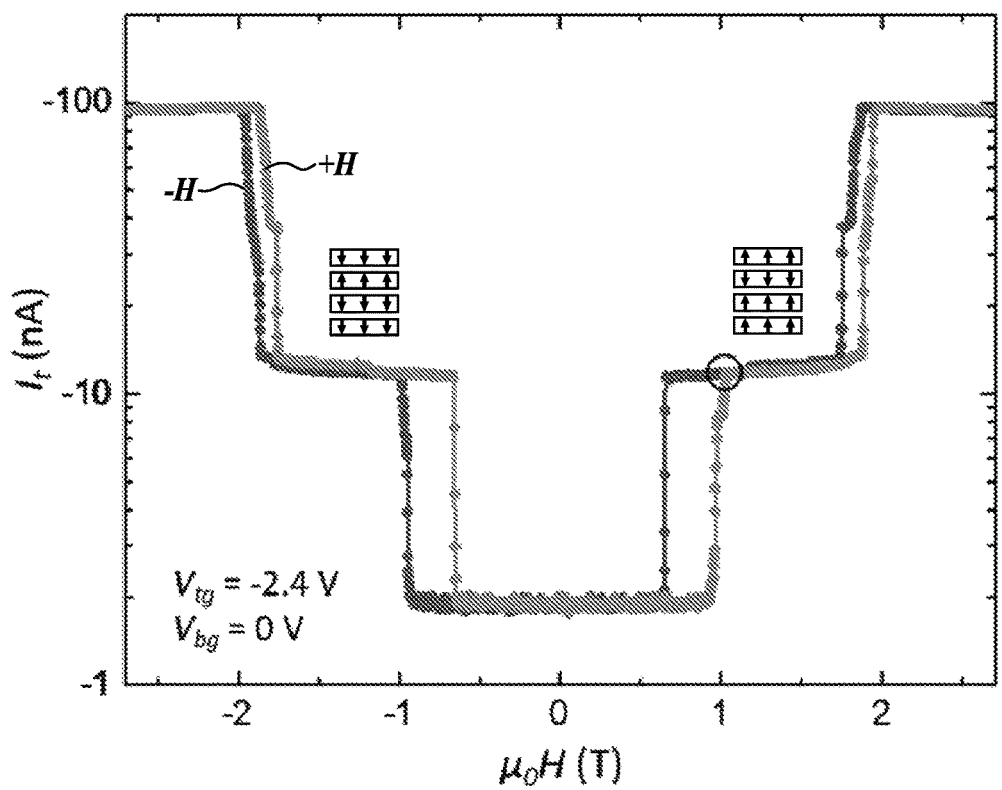
Figure 7B:
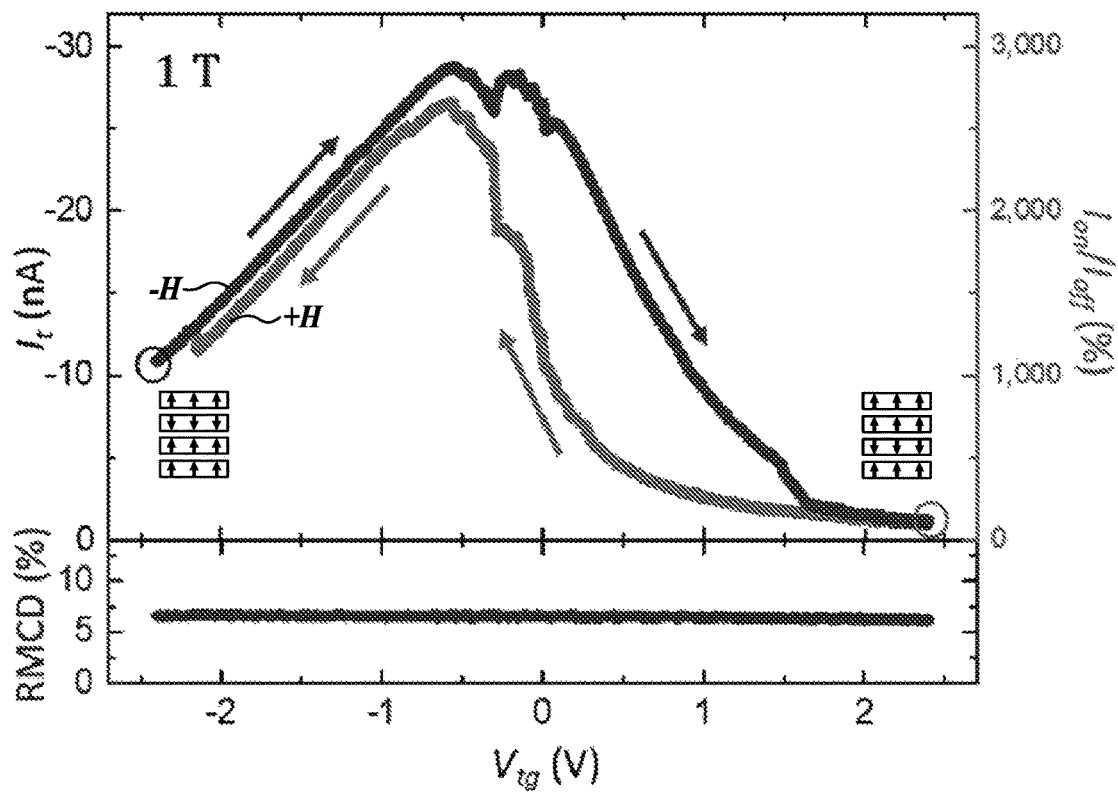
Figure 7C:
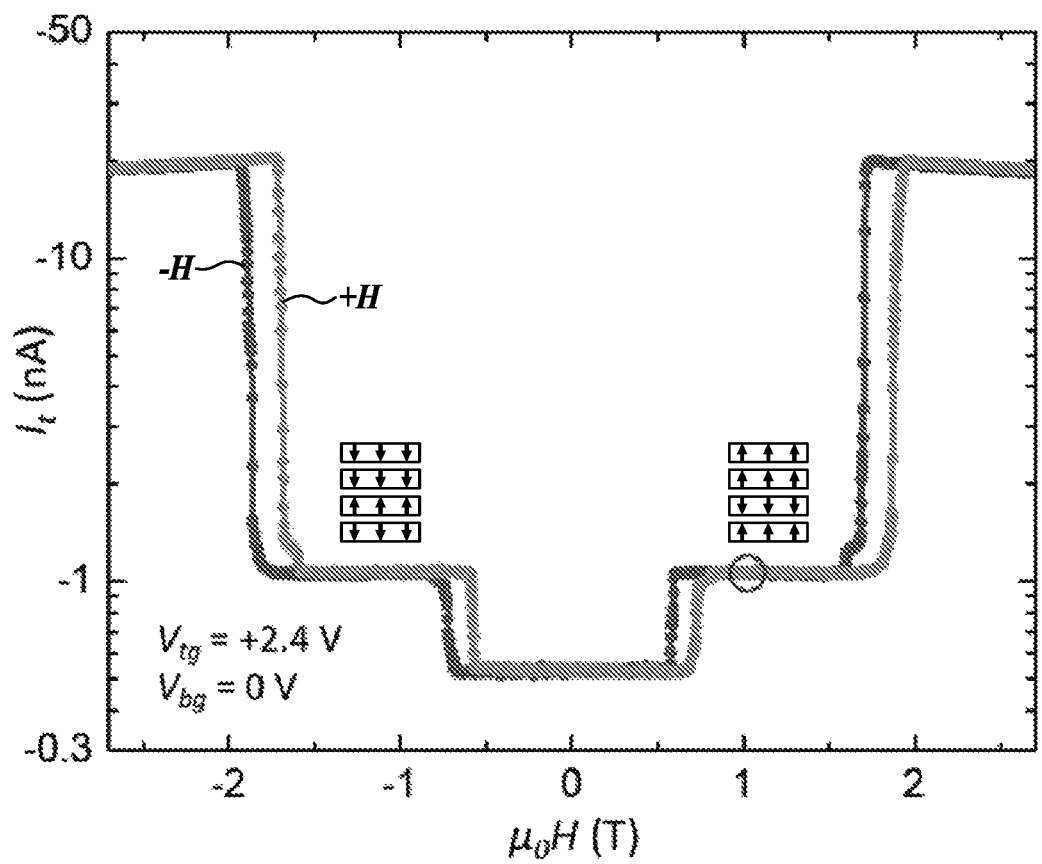

FIGS. 7A-7C. Reversible voltage switching of the bistable magnetic states. FIGS. 7A, 7C, $I_t$ (V=−240 mV) as a function of $\mu_0H$ at two representative gate voltages with identified magnetic states shown in the insets. FIG. 7B, $I_t$ and the extracted magnetoresistance ratio as a function of $V_{tg}$ swept from +2.4 V to −2.4 V and back to +2.4 V at fixed $\mu_0H$=1 T. The open circles denote the two ends of the voltage sweep loop, corresponding to the same states circled in FIGS. 7A and 7C, respectively. The FIG. 7B hysteresis curve demonstrates magneto-electric coupling. The bottom panel shows little changes in RMCD during the voltage sweep, consistent with the equal magnetization of the bistable states.

Figure 8A:
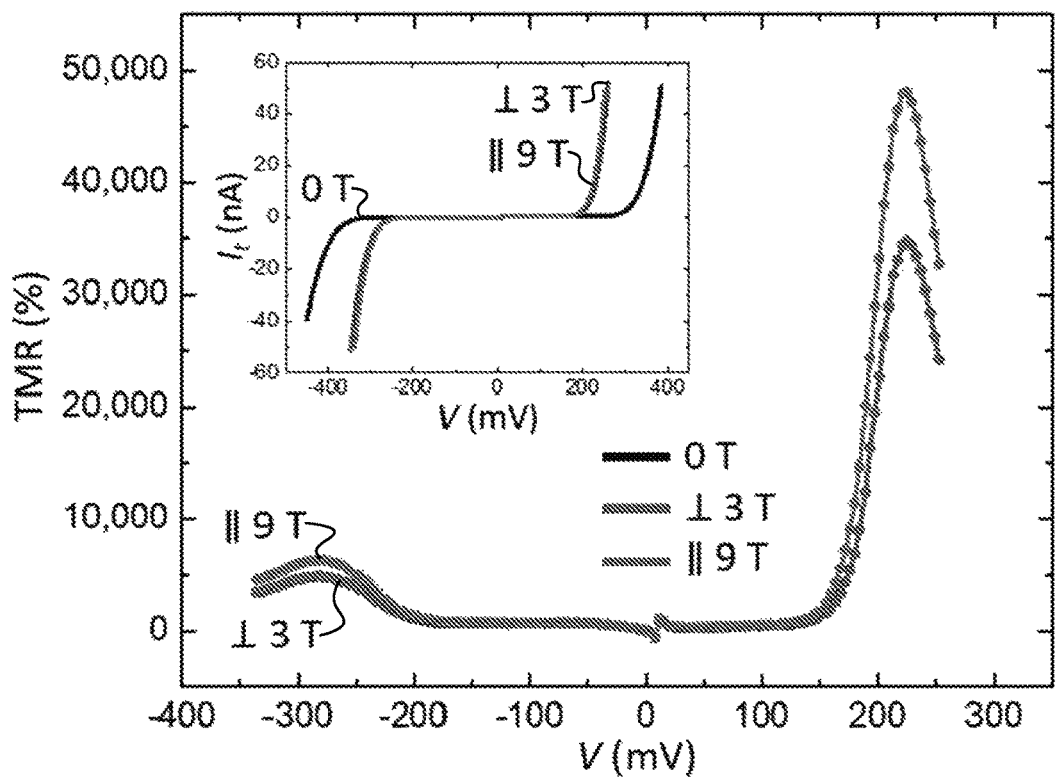
Figure 8B:
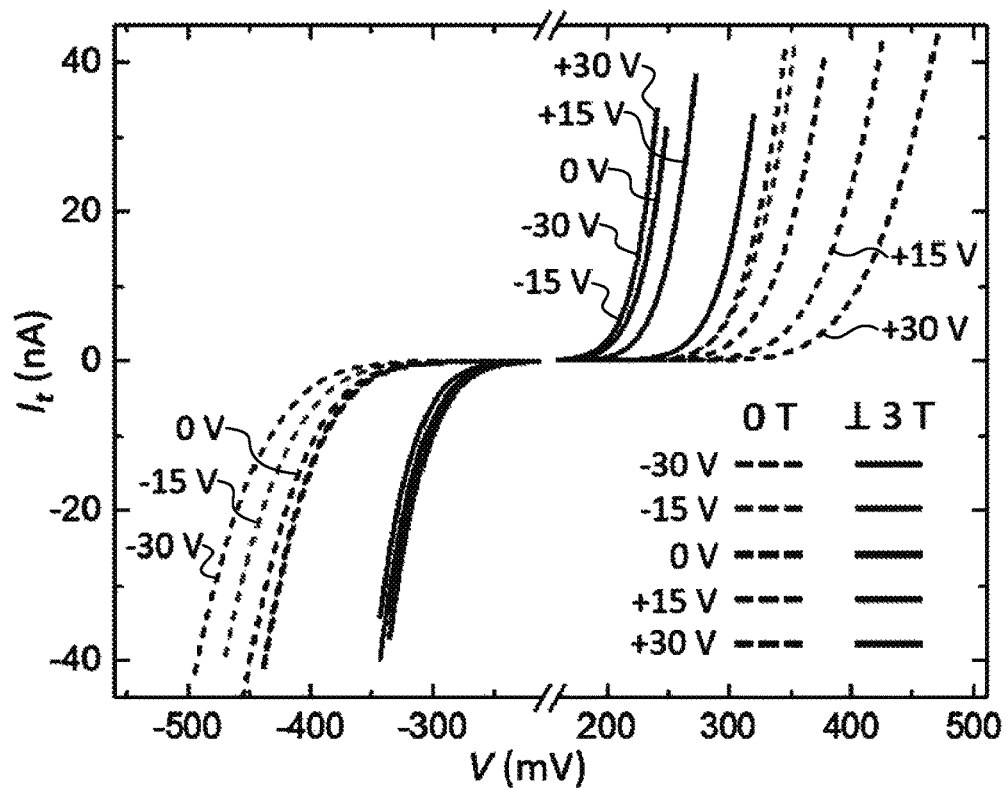
Figure 8C:
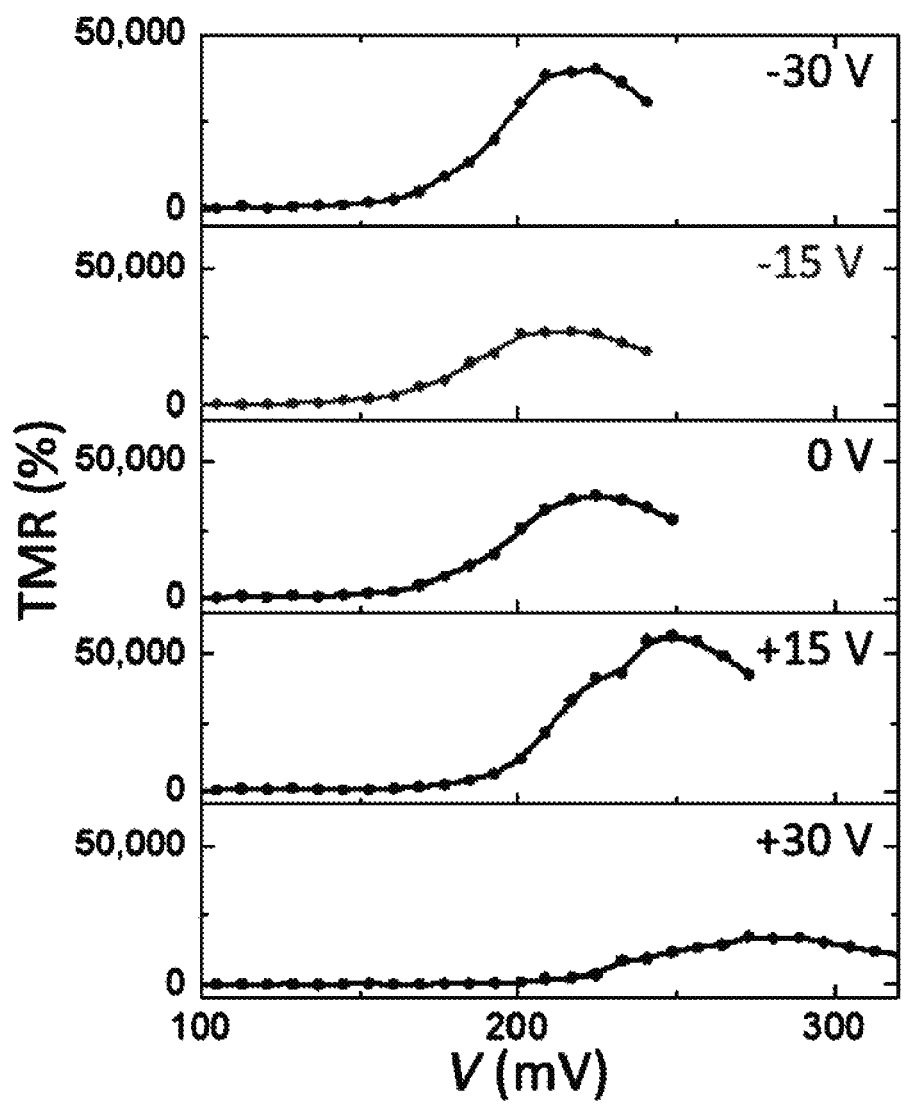

FIGS. 8A-8C. Gate tunable tunneling magnetoresistance. FIG. 8A, TMR ratio as a function of V derived from the $I_t$-V data shown in the inset, at $V_{bg}$=0 V. FIG. 8B, $I_t$-V curves at five representative gate voltages for layered-antiferromagnetic ground states (dashed curves, at 0 T) and fully aligned magnetic states (solid curves, at 3 T). FIG. 8C, TMR ratio as a function of V at a series of $V_{bg}$.

DETAILED DESCRIPTION

Disclosed herein are devices, systems, and methods that provide improved tunneling magnetoresistance (TMR) through the use of innovative device structures and heterostructure layers therein. The disclosed devices include spin filters, which create and control spin-polarized currents, and are the fundamental element in magnetic multilayer devices, such as spin valves, magnetic tunnel junctions (MTJs) and double spin-filter MTJs (sf-MTJs). Compared with the existing magnetic multilayer devices that require different choices of (metallic or insulating) magnets and spacers, the disclosed heterostructure materials avoid the need for fabricating separate spin filters with spacers. This guarantees sharp atomic interfaces between spin filters, crucial for achieving large TMR.

Many two-dimensional (2D) materials can be incorporated into artificial heterostructures without the need for lattice matching. These materials thus provide a unique platform for exploring emerging phenomena and device function at the designed atomic interfaces. However, magnetic memory and processing applications were out of reach in van der Waals (vdW) heterostructures before the recent discovery of suitable 2D magnetic materials. One of these is the magnetic insulator chromium triiodide ($CrI_3$), which in bilayer form has been found to possess a layered-antiferromagnetic ground state. While chromium triiodide is discussed at length in the present disclosure, it should be appreciated that other magnetic insulators capable of forming heterostructures (e.g., vdW heterostructures) as disclosed herein can be integrated into the disclosed devices, systems, and methods.

Figure 1A:
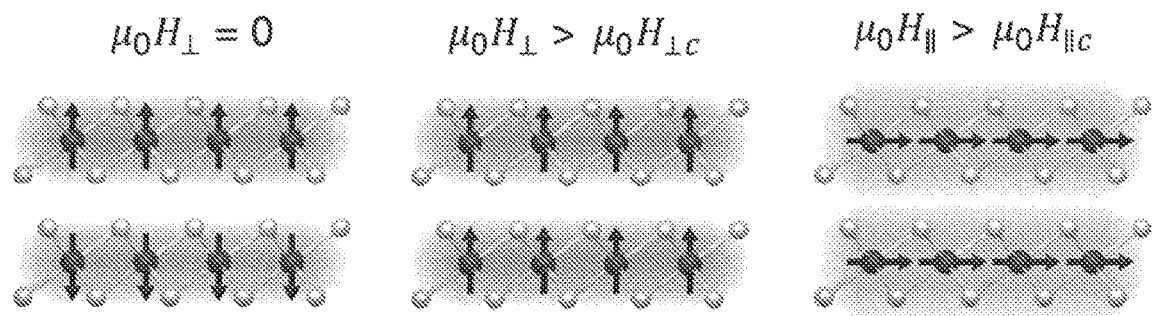
FIGS. 1A-1D. Spin-filter effects in layered-antiferromagnetic $CrI_3$.

Magneto-optical Kerr effect (MOKE) measurements suggest that the spins align ferromagnetically out-of-plane within each layer but antiferromagnetically between layers, resulting in vanishing net magnetization (FIG. 1A, left).

This layered-antiferromagnetic ordering makes $CrI_3$ desirable for realizing atomically thin magnetic multilayer devices. When the magnetizations of the two layers in a bilayer are switched between anti-parallel (FIG. 1A, left) and parallel states (FIG. 1A, middle and right), giant tunneling magnetoresistance (TMR) is produced by the double spin-filtering effect. In general, spin filters, which create and control spin-polarized currents, are the fundamental element in magnetic multilayer devices, such as spin valves, magnetic tunnel junctions (MTJs) and double spin-filter MTJs (sf-MTJs). Compared with the existing magnetic multilayer devices that require different choices of (metallic or insulating) magnets and spacers, the layered-antiferromagnetic structure in bilayer $CrI_3$ avoids the need for fabricating separate spin filters with spacers. This guarantees sharp atomic interfaces between spin filters, crucial for achieving large sf-TMR.

An even more intriguing possibility arises if the intrinsic layered-antiferromagnetic structure of $CrI_3$ extends beyond the bilayer. In this case, every layer should act as another spin filter oppositely aligned in series, greatly enhancing the sf-TMR as the number of layers increases. The associated multiple magnetic states may also enable multiple magnetoresistance states for potentially encoding information in an individual sf-MTJ device. Moreover, being insulators, atomically thin $CrI_3$ single crystals can be integrated into vdW heterostructures as tunnel barriers in place of non-magnetic dielectrics, such as hexagonal boron nitride (hBN) or transition metal dichalcogenides, adding magnetic switching functionality. The realization of such vdW heterostructure sf-MTJs could produce novel 2D magnetic interface phenomena and enable spintronics components such as spin current sources and magnetoresistive random-access memory (MRAM) at atomically thin limit.

MTJ Devices and Systems

Accordingly, in one aspect a system for controlling electric current across a magnetic tunnel junction is provided. In one embodiment, the system includes:

a magnetic tunnel barrier comprising a layered structure having a first magnetic layer with a first magnetic vector and a second magnetic layer with a second magnetic vector that is opposite to the first magnetic vector;

a first electrode that is not magnetic and is electrically connected to the first magnetic layer; and a second electrode that is not magnetic and is electrically connected to the second magnetic layer;

wherein the magnetic tunnel barrier permits significantly larger tunneling current to tunnel from the first electrode to the second electrode only when the first magnetic vector and the second magnetic vector are aligned.

Figure 1B:
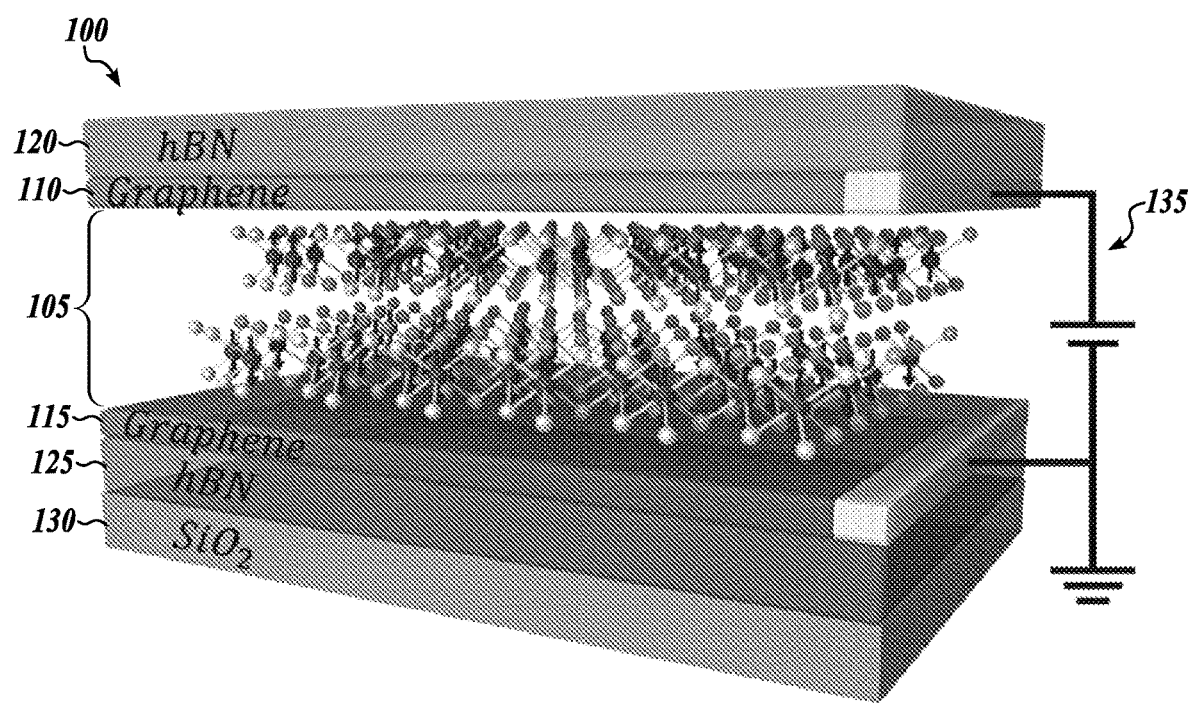

A representative system and device is illustrated in FIG. 1B. The basic device includes a magnetic tunnel barrier 105, which is a bilayer (e.g., of chromium triiodide) as illustrated. Further disclosed embodiments include a magnetic tunnel barrier 105 with 3, 4, or more layers.

The magnetic tunnel barrier 105 is a layered magnet, meaning it is formed from a plurality of previously separate, monolithic layers. As an example, two monolayers of a material such as chromium triiodide may be physically brought together and joined by van der Waals forces to form a bilayer. The layered magnet includes a first magnetic layer with a first magnetic vector and a second magnetic layer with a second magnetic vector that is opposite to the first magnetic vector. Essentially, at a ground state the bilayer is antiferromagnetic.

The magnetic tunnel barrier 105 is in between a first electrode 110 and a second electrode 115, which are illustrated in FIG. 1B as graphene, for an example. The electrodes 110 and 115 need not be the same material, but in a representative embodiment are the same material. The electrodes 110 and 115 are configured to make electrical contact with the magnetic tunnel barrier 105 across their abutting surfaces, so as to provide consistent contact and current flow through the barrier 105 during device operation. The electrodes 110 and 115, as well as other layers of the device 100, such as insulating layers 120 and 125, in some embodiments serve to encapsulate the barrier 105 from the atmosphere, for example if the barrier 105 were susceptible to oxidation the encapsulation would enable device functionality, robustness, and longevity when exposed to oxidative environments.

In certain embodiments the electrodes 110 and 115 are attached to the barrier 105 by physically abutting pre-formed electrode material (e.g., graphene or graphite flakes), thereby forming a vdW bond to the barrier 105. In other embodiments, the electrodes 110 and 105 are deposited onto the barrier 105 using liquid or vapor methods, such as sputtering. In one embodiment, the first electrode 110 or the second electrode 115, or both, comprise graphene or graphite.

Insulating layers 120 and 125 cover the stack formed by the barrier 105 and electrodes 110 and 115, to provide electronic and environmental shielding. As illustrated in exemplary form in FIG. 1B, hexagonal boron nitride (hBN) is used as a material that can be vdW stacked with the other device components to provide simple assembly of the device and oxidation protection. In other embodiments, liquid or vapor-deposition techniques are used to deposit the insulating layers 120 and 125.

In certain embodiments, a substrate 130 is included onto which the device is placed or fabricated. Silicon (oxide) is an exemplary substrate, in view of the extensive use of the materials and techniques available for working with silicon (oxide).

Returning to operation of the device, the magnetic tunnel barrier 105 permits significantly larger tunneling current to tunnel from the first electrode 110 to the second electrode 115 only when the first magnetic vector and the second magnetic vector are aligned. As used herein, the term "significantly larger" indicates that the tunneling current is drammatically increased at least 300% when the first and second magnetic vectors are aligned.

Put in a different manner, electrical current running through the barrier 105 is larger if the magnetizations (magnetic vectors) within the layers of the barrier 105 point in the same direction compared to if they point in opposite directions (as they do at ground magnetic state).

In one embodiment, first electrode 110 and the second electrode 115 are asymmetric. This causes asymmetric TMR when the bias voltage is reversed.

FIG. 1A helps to illustrate the magnetic vectors (illustrated as arrows) of the magnetic layers of the barrier 105. The left diagram of FIG. 1A shows a ground magnetic state with antiferromagnetic ordering between the layers. The magnetic layers, are atomically thin limit, naturally have antiferromagnetic ordering, which enables operation of the device. Turning to the center diagram of FIG. 1A, a magnetic field is applied perpendicular to the barrier 105 that uniformly aligns the magnetic vectors of the layers, which produces increased TMR. The right diagram of FIG. 1A shows another embodiment of operation, with increased TMR being generated by alignment of the magnetic vectors in the plane of the barrier 105. Examples 1 and 2 below further discuss the operation and theoretical underpinnings of the devices.

Turning to further specific details of the magnetic layers of the barrier 105, the disclosed embodiments represent essentially the thinnest devices of this type possible, as the functional aspects required to operate the device—at least two magnetic monolayers and two electrodes, each of which may be a single atomic layer (e.g., graphene)—are collectively only a few nanometers in thickness. Accordingly, in one embodiment, the combined barrier 105 and electrodes 110 and 115 are collectively less than 50 nm thick. In a further embodiment, the combined barrier 105 and electrodes 110 and 115 are collectively less than 25 nm thick. In a further embodiment, the combined barrier 105 and electrodes 110 and 115 are collectively less than 10 nm thick. In a further embodiment, the combined barrier 105 and electrodes 110 and 115 are collectively less than 5 nm thick.

In one embodiment, the magnetic layers of the barrier 105 are connected by van der Waals forces. The vdW connection between layers of the device allows for simple fabrication and results in molecularly flat device surfaces.

In one embodiment, the layered magnetic barrier 105 further includes at least one additional magnetic layer, connected by van der Waals forces. As noted previously, there may be three or more magnetic layers, each formed from a monolayer, with the resulting spin vectors having antiferromagnetic configuration between layers, thus resulting in an antiferromagnetic magnetic ground state.

In a specific embodiment, the layered magnetic barrier has a total of three or four magnetic layers and the magnetic spin vector of each magnetic layer is opposite its adjacent layers at ground state. Three- and four-magnetic-layer devices are disclosed herein in Examples 1 and 2 and introduce the additional feature of tuning TMR properties by magnetically aligning certain, but not all, magnetic layers.

Accordingly, in certain embodiments the layered magnetic barrier exhibits multiple intermediate tunneling magnetoresistance states in proportion to the number of magnetic layers. This concept is developed further with regard to devices and theory in Examples 1 and 2.

In one embodiment, the first and second magnetic layers, as well as any further magnetic layers, comprise crystalline chromium triiodide having a unit-cell formula $CrI_3$. As noted previously, chromium triiodide is an exemplary material and is used in the devices disclosed herein. However, it will be appreciated that other materials which have the same magnetic structures as $CrI_3$, may also be used, for example, $CrCl_3$.

In one embodiment, the layered heterostructure is characterized by a tunneling magnetoresistance in the range of 310% to 57,000%. This TMR shows dramatic improvement over conventional TMJ devices. In one embodiment, the layered heterostructure is characterized by a tunneling magnetoresistance in the range of 1000% to 57,000%. In one embodiment, the layered heterostructure is characterized by a tunneling magnetoresistance in the range of 1000% to 19,000%.

In another embodiment, the system includes a magnet (140 in FIG. 1D) configured to apply a magnetic field to the layered heterostructure sufficient to modulate the magnetizations of the magnetic layers. As previously discussed, the devices operate by manipulating magnetization of the layers of the heterostructure junction 105. A source of a magnetic field allows the system to control the magnetization. Further details about applying a magnetic field are found in Examples 1 and 2.

Exemplary magnets—sources of magnetic field—include permanent magnets and electromagnets. If an electromagnet is utilized, it can be networked in communication with the device and controller (150 in FIG. 1D) that is configured to control both the magnet and the power source connected to the device. If a temperature control system is also utilized, a controller can be configured to control the temperature control system, as well as the magnet and power source.

In one embodiment, the magnet is configured to apply a magnetic field normal to an in-plane direction of the layered heterostructure. In device structures such as those illustrated in, for example, FIG. 1B, a normal magnetic field is applied perpendicular to the stack of the device 100 (perpendicular to the "plane" or "major surface" of the device 100). This results in controlled magnetization to produce the center diagram of FIG. 1A and results in current flow through the device parallel to the magnetization direction (as illustrated in the lower images of FIG. 1C, center diagram).

In another embodiment, the magnet is configured to apply a magnetic field parallel to an in-plane direction of the layered heterostructure. Converse to the above configuration, magnetization in-plane of the device produces the FIG. 1A right-side diagram, and results in current flow through the device perpendicular to the magnetization direction (as illustrated in the lower images of FIG. 1C, rightmost diagram).

Figure 1C:
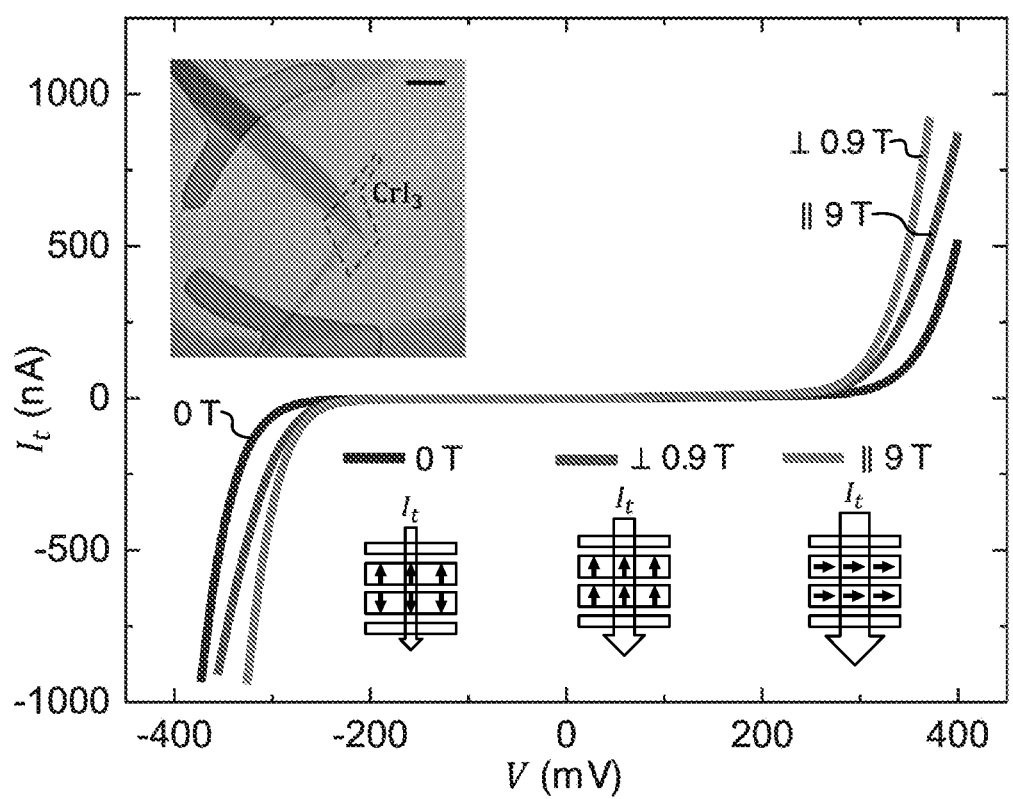

In one embodiment, the external applied magnetic field is characterized by a field strength in the range of 0 Tesla to 9 Tesla. In one embodiment, the external applied magnetic field is characterized by a field strength in the range of greater than zero Tesla (e.g., 0.1) to 9 Tesla. In a particular embodiment, where the magnetic field is applied perpendicular to the heterostructure, the external applied magnetic field is characterized by a field strength in the range of 0 Tesla to 1.5 Tesla. As illustrated in FIG. 2A, 1 T is sufficient to operate (switch) a bilayer device when the field is applied perpendicular to the heterostructure. In another particular embodiment, where the magnetic field is applied parallel to the heterostructure, the external applied magnetic field is characterized by a field strength in the range of 0 Tesla to 9 Tesla. As illustrated in FIG. 2A and other included data, application of the magnetic field parallel to the heterostructure typically requires a stronger field when compared to the perpendicular application of the field.

In one embodiment, the system further includes a voltage source electrically coupled to the first electrode and the second electrode, and configured to apply an electric field to the layered heterostructure sufficient to modify the magnetizations of the magnetic layers. Referring to FIG. 1B, the voltage source 135 is connected to the first electrode 110 and the second electrode 115. In one embodiment, the voltage source is configured to operate in the range of −2.4 V to 2.4 DC Volts.

Figure 1D:
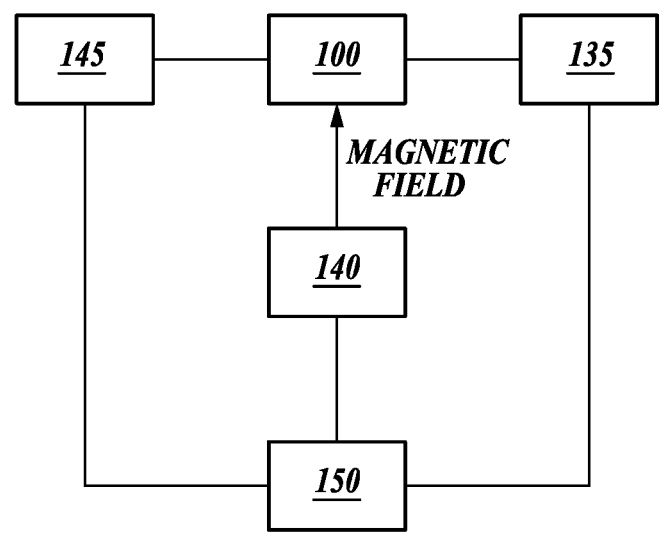
Figure 2A:
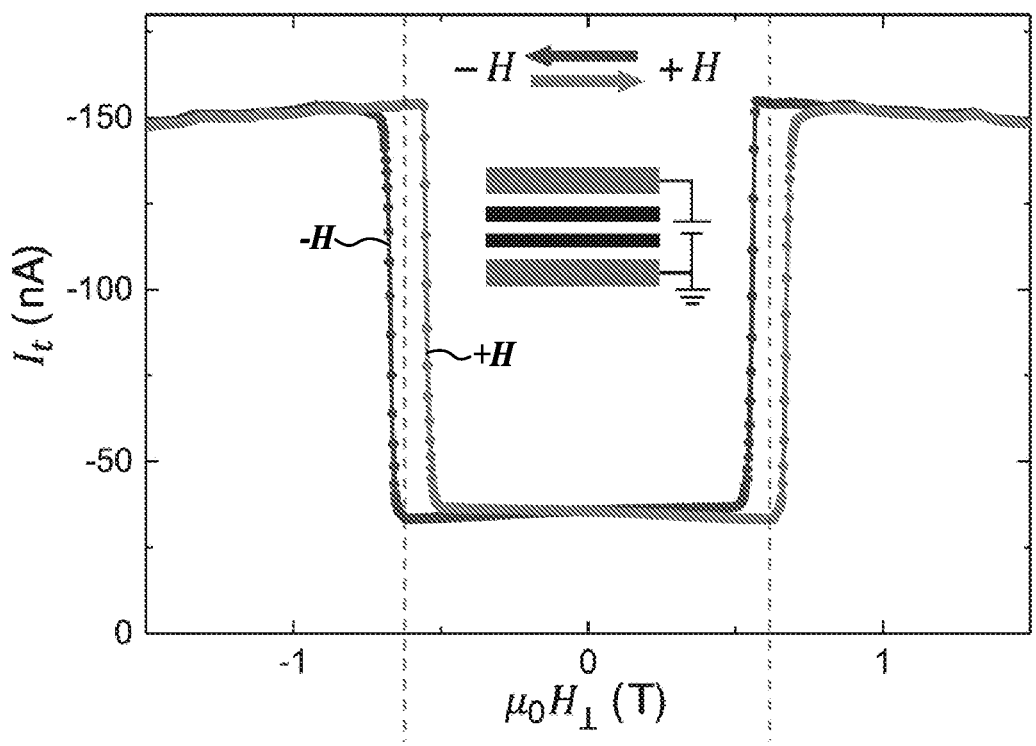
FIGS. 2A-2D. Double spin-filter MTJ from bilayer $CrI_3$.

The voltage source 135 is additionally illustrated in FIG. 1D, which provides a diagram of a system for controlling a device (e.g., 100 or 200) as disclosed herein. The system of FIG. 1D includes the device 100, which is electronically connected to the voltage source 135. A magnet 140 delivers a magnetic field to the device 100. A temperature control system 145 is configured to control the temperature in the environment surrounding the device 100. Finally, a controller 150 is connected to, and controls, the operation of the device by controlling the voltage source 135, magnet 140, and temperature control system 145. In certain embodiments, the controller 150 is configured to control a subset of the illustrated components. For example, in one embodiment, the controller 150 controls the voltage source 134 and magnet 140, but not the temperature control system 145.

In another embodiment, they system further includes a temperature control system (145 in FIG. 1D) configured to cool the system below a critical temperature of the magnetic material. The critical temperature of the material is defined as the temperature at or below which magnetization occurs. Representative types of temperature control systems include a cryostat configured to cool below 2 K. An exemplary temperature control system is described in Example 2. As noted previously, a temperature control system is controlled by a system controller in certain embodiments.

Gate Electrode Devices In certain embodiments, the devices have one or more "gate" electrodes, as discussed extensively in Example 2. The gate electrode allows for voltage control of TMR in the device. By varying the gate voltage at a fixed magnetic field, the device can be switched reversibly between bistable magnetic states with the same net magnetization but drastically different resistance—by a factor of ten or more. Additionally, without switching the state, the TMR can be continuously modulated between 17,000% and 57,000%, due to the combination of gate modulation of spin-dependent tunnel barrier with changing carrier distribution in the electrode contacts. Essentially, these are voltage-controlled van der Waals spintronic devices.

Turning now to the structure of gate devices, FIG. 5A illustrates an exemplary two-gate device 200. The core of the two-gate device 200 is the same as the devices previously disclosed—designated here as a device 100'. To the device 100' is added at least one gate electrode 205 (for a single-gate device); a two-gate device has a second gate electrode 210. A gate electrode 205 is separated from the first electrode by an insulating layer, and distal to the heterostructure. A gate electrode 210 is separated from the second electrode by an insulating layer, and distal to the heterostructure.

A gate-voltage control system 225 includes a similar voltage control system 135 as previously disclosed, but also includes voltage control connections 215 (top-gate voltage) and 220 (bottom-gate voltage).

It should be appreciated that a single-gate device is contemplated and has also been fabricated and operates on the same principles as a double gate device, as described.

The disclosed gate devices can be integrated into systems as those described herein with regard to no-gate devices. For example, the gate devices can be controlled and integrated into a system that includes magnetic, voltage, and temperature control. For these local-gate structures, only a few volts are needed to realize gate control.

Methods of Operation

Methods of operating the disclosed systems and devices are also provided. Accordingly, in another aspect, a method of controlling an electric current across a magnetic tunnel barrier in a system of the type disclosed herein is provided, the magnetic tunnel barrier having a characteristic magnetic structure, and the method comprising:

applying a voltage to the magnetic tunnel barrier, between the first electrode and the second electrode; and applying a magnetic field to the layered heterostructure.

Any of the disclosed devices and systems are compatible with the methods of operating. The fundamental steps of the method include applying a voltage across the magnetic tunnel barrier and applying a magnetic field to the layered heterostructure in order to manipulate the magnetization so that it is in some way distinct from the ground state. Examples include uniform magnetization (parallel or normal to the plane of the heterostructure) or partially uniform magnetization (e.g., 3 of 4 magnetic layers aligned).

In one mode of operation, the device is controlled by modulating the magnetic field to control an electric current flowing from the first electrode to the second electrode.

In the simplest form this is a constant voltage across the electrodes with current controlled by magnetic field modulation. This method is primarily described in Example 1.

A second mode of operation, as described in Example 2, includes a fixed magnetic field (e.g., to align some or all layers) and modulation of the current between the electrodes by applying a voltage to a gate electrode—or two gate electrodes, in certain embodiments.

The characteristics of operation according to the method are those described herein, with regard to magnetic field, electrical control, temperature, and modes of operation.

In one embodiment, the method further includes a step of cooling the layered heterostructure to a temperature below the critical temperature of the magnetic material. In one embodiment, cooling the layered heterostructure comprises cooling below 2 K.

In one embodiment, the method further includes a step of aligning the magnetic field either normal to or parallel to the in-plane direction of the layered heterostructure.

In one embodiment, the method further includes modulating the voltage applied to one or more gate electrodes to control the electric current flowing between the first electrode and the second electrode.

In one embodiment, the method further includes modulating the magnetic field to control the electric current flowing between the first electrode and the second electrode.

In one embodiment, the method further includes repeatedly modulating the magnetic field to toggle the layered heterostructure between states with different magnetoresistance.

In one embodiment, the layered heterostructure exhibits multiple intermediate magnetic states, and wherein the method further comprises modulating the magnetic field and applied voltage to select for one of the multiple intermediate magnetic states with distinct magnetoresistance.

In one embodiment, applying the magnetic field to the layered heterostructure comprises applying a magnetic field in the range of 0 to 9 Tesla. In one embodiment, applying the magnetic field to the layered heterostructure comprises applying a magnetic field in the range of greater than 0 Tesla (e.g., 0.1 Tesla) to 9 Tesla.

The following Examples are included for the purpose of illustrating, not limiting, the disclosed embodiments.

Example 1: Fabrication and Testing of Basic Heterostructure Magnetic Tunnel Barriers Many two-dimensional (2D) materials can be incorporated into artificial heterostructures without the need for lattice matching. These materials thus provide a unique platform for exploring emerging phenomena and device function at the designed atomic interfaces. However, magnetic memory and processing applications were out of reach in van der Waals (vdW) heterostructures before the recent discovery of suitable 2D magnetic materials. One of these is the magnetic insulator chromium triiodide ($CrI_3$), which in bilayer form has been found to possess a layered-antiferromagnetic ground state. Magneto-optical Kerr effect (MOKE) measurements suggest that the spins align ferromagnetically out-of-plane within each layer but antiferromagnetically between layers, resulting in vanishing net magnetization (FIG. 1A, left).

This layered-antiferromagnetic ordering makes $CrI_3$ desirable for realizing atomically thin magnetic multilayer devices. When the magnetizations of the two layers in a bilayer are switched between anti-parallel (FIG. 1A, left) and parallel states (FIG. 1A, middle and right), giant tunneling magnetoresistance (TMR) is produced by the double spin-filtering effect. In general, spin filters, which create and control spin-polarized currents, are the fundamental element in magnetic multilayer devices, such as spin valves, magnetic tunnel junctions (MTJs) and double spin-filter MTJs (sf-MTJs). Compared with the existing magnetic multilayer devices that require different choices of (metallic or insulating) magnets and spacers, the layered-antiferromagnetic structure in bilayer $CrI_3$ avoids the need for fabricating separate spin filters with spacers. This guarantees sharp atomic interfaces between spin filters, crucial for achieving large sf-TMR.

An even more intriguing possibility arises if the intrinsic layered-antiferromagnetic structure of $CrI_3$ extends beyond the bilayer. In this case, every layer should act as another spin filter oppositely aligned in series, greatly enhancing the sf-TMR as the number of layers increases. The associated multiple magnetic states may also enable multiple magnetoresistance states for potentially encoding information in an individual sf-MTJ device. Moreover, being insulators, atomically thin $CrI_3$ single crystals can be integrated into vdW heterostructures as tunnel barriers in place of non-magnetic dielectrics, such as hexagonal boron nitride (hBN) or transition metal dichalcogenides, adding magnetic switching functionality. The realization of such vdW heterostructure sf-MTJs could produce novel 2D magnetic interface phenomena and enable spintronics components such as spin current sources and magnetoresistive random-access memory (MRAM).

Here, we demonstrate vdW-engineered sf-MTJs based on atomically thin $CrI_3$ with extraordinarily large sf-TMR. FIG. 1B shows the essential structure of the sf-MTJ, which consists of two few-layer graphene contacts separated by a thin $CrI_3$ tunnel barrier. The sf-MTJ is sandwiched between two hexagonal boron nitride (hBN) flakes to avoid degradation. We have made and investigated devices with bilayer, trilayer, and four-layer $CrI_3$. All measurements were carried out at a temperature of 2 K, unless otherwise specified.

We begin with the case of bilayer $CrI_3$. The inset of FIG. 1C is an optical micrograph of a device with the structure illustrated in FIG. 1B, obtained by stacking exfoliated 2D materials using a dry transfer process in a glovebox (explained in further detail in Example 2 below). The tunneling junction area is less than ~1 $\mu m^2$ to avoid effects caused by lateral magnetic domain structures. FIG. 1C shows the tunneling current ($I_t$) as a function of DC bias voltage (V) at selected magnetic fields ($\mu_0$H). Unlike in tunneling devices using non-magnetic hBN as the barrier, it has a strong magnetic field dependence. As shown in FIG. 1C, $I_t$ is much smaller at $\mu_0$H=0 T than it is in the presence of an out-of-plane field ($\mu_0H_\perp$) or an in-plane field ($\mu_0H_\parallel$). This magnetic-field-dependent tunneling current implies a spin-dependent tunneling probability related to the field-dependent magnetic structure of bilayer CrI$_3$.

Figure 2B:
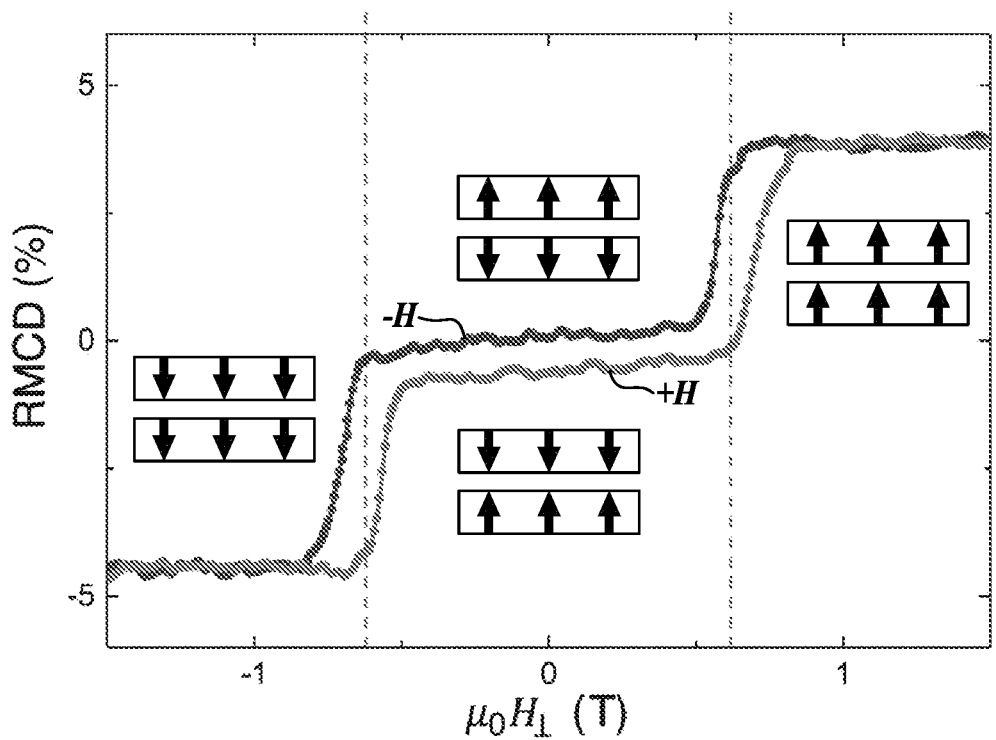

To investigate the connection between the bilayer CrI$_3$ magnetic states and the magnetoresistance, we measured $I_t$ as a function of $\mu_0H_\perp$ at a particular bias voltage (−290 mV). The curves in FIG. 2A correspond to decreasing and increasing magnetic fields. $I_t$ exhibits plateaus with two values, about −36 nA and −155 nA. The lower plateau is seen at low fields, and there is a sharp jump to the higher plateau when the magnetic field exceeds a critical value. We also employed reflective magnetic circular dichroism (RMCD) to probe the out-of-plane magnetization of the bilayer CrI$_3$ near the tunneling area. FIG. 2B shows the RMCD signal as a function of $\mu_0H_\perp$ under similar experimental conditions to the magnetoresistance measurements. The signal is small at low fields, corresponding to a layered-antiferromagnetic ground state (↑↓ or ↓↑), where the arrows indicate the out-of-plane magnetizations in the top and bottom layers respectively. As the magnitude of the field increases there is a step up to a larger signal corresponding to the fully spin-polarized states (↑↑ and ↓↓), consistent with earlier MOKE measurements on bilayer CrI$_3$.

A direct comparison of $I_t$ and RMCD measurements provides the following explanation of the giant sf-TMR: in the ↑↓ or ↓↑ states at low field the current is small because spin-conserving tunneling of an electron through the two layers in sequence is suppressed. The step in $I_t$ occurs when the magnetic field drives the bilayer into the ↑↑ and ↓↓ states and this suppression is removed. This is known as the double spin-filtering effect, and it can be modeled by treating the two monolayers as tunnel-coupled spin-dependent quantum wells.

Figure 2C:
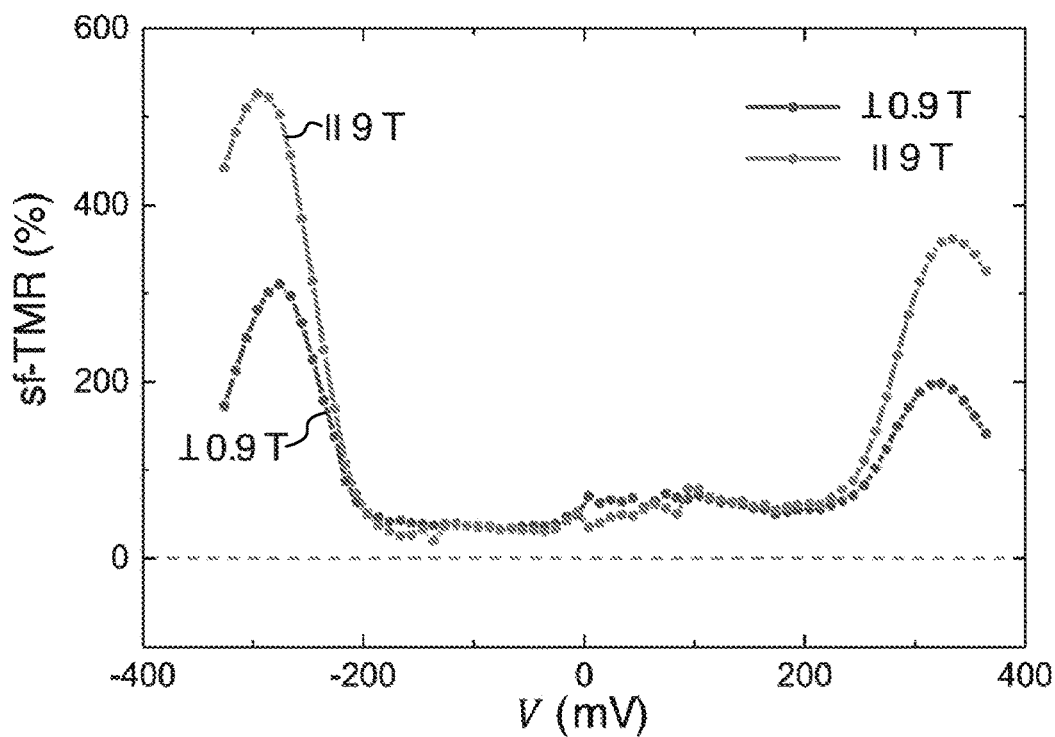

We quantify the sf-TMR by ($R_{ap}-R_p$)/$R_p$, where $R_{ap}$ and $R_p$ are the DC resistances with anti-parallel and parallel spin alignment in bilayer CrI$_3$, respectively, measured at a given bias. FIG. 2C shows the value of this quantity as a function of bias extracted from the $I_t$-V curves in FIG. 1C. The highest sf-TMR achieved is 310% for magnetization fully aligned perpendicular to the plane and 530% for parallel alignment. The sf-TMR decreases as temperature increases and vanishes above the critical temperature at about 45 K.

The fact that the sf-TMR for in-plane magnetization is larger than for out-of-plane implies anisotropic magnetoresistance, which is a common feature in ferromagnets and is a sign of anisotropic spin-orbit coupling stemming from the layered structure of CrI$_3$. The sf-TMR is also peaked at a certain bias and asymmetric between positive and negative bias. These observations are similar to the reported double sf-MTJs based on EuS thin films, where the asymmetry is caused by the different thickness and coercive fields of the two EuS spin-filters. Likewise, our data imply that the device lacks up-down symmetry, possibly because the few-layer graphene contacts are not identical in thickness. This broken symmetry also manifests as tilting of the current plateaus (FIG. 2A) and the finite non-zero RMCD value (FIG. 2B) in the layered-antiferromagnetic states.

Figure 2D:
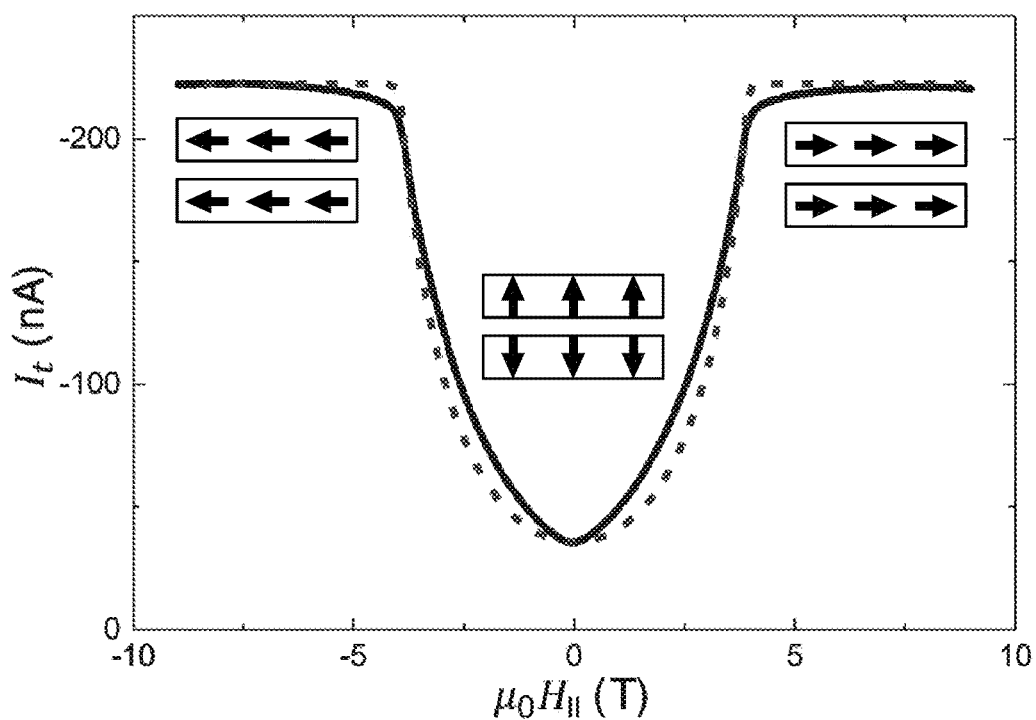

To further investigate magnetic anisotropy and the assignment of magnetic states in the bilayer, we measured $I_t$ as a function of in-plane magnetic field. As shown in FIG. 2D, $I_t$ is smallest at zero field, in the layered-antiferromagnetic state, and smoothly increases with the magnitude of the field. This behavior has a natural interpretation in terms of a spin-canting effect. Once the magnitude of $\mu_0H_\parallel$ exceeds about 4 T, the spins are completely aligned with the in-plane field and $I_t$ saturates. Simulations of the canting effect to match the data yield a magnetic anisotropy field of 3.8 T, much larger than the out-of-plane critical magnetic field of ±0.6 T seen in FIG. 2A. These results therefore both demonstrate and quantify a large out-of-plane magnetic anisotropy in bilayer CrI$_3$.

Figure 3A:
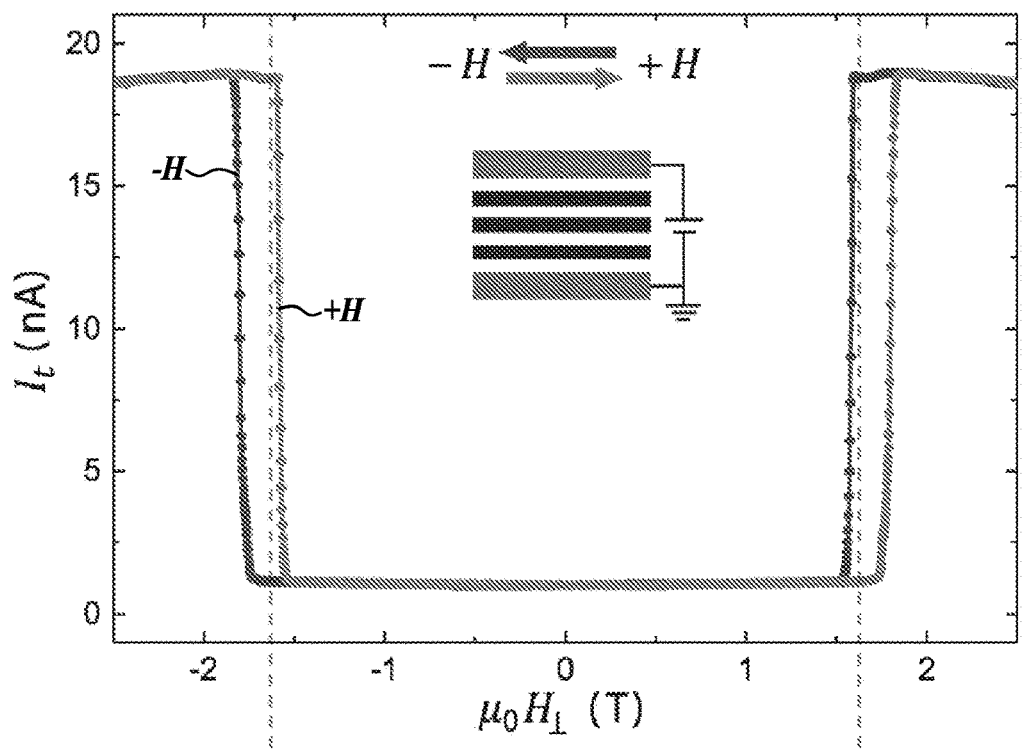
FIGS. 3A-3C. Giant sf-TMR of a trilayer $CrI_3$ sf-MTJ.
Figure 3B:
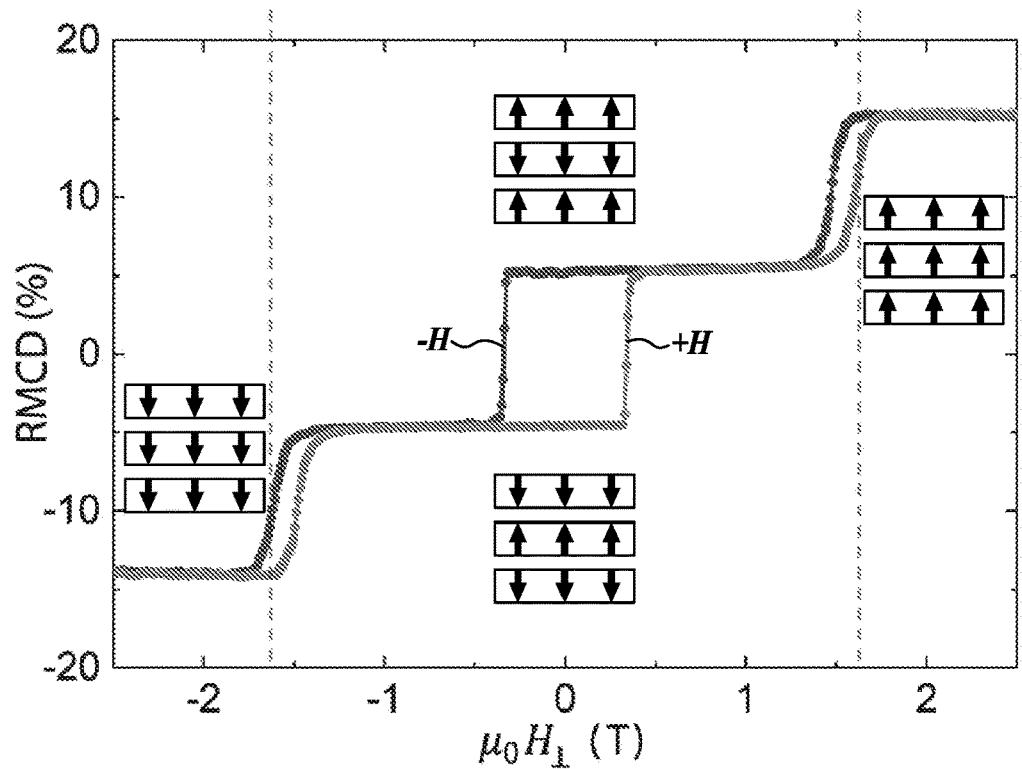

We next consider the trilayer case. FIGS. 3A and 3B show $I_t$ and RMCD, respectively, for a trilayer CrI$_3$ sf-MTJ as a function of out-of-plane field. There are four plateaus in the RMCD signal, at −14%, −5%, 5% and 15%, the ratio between which is close to −3:−1:1:3. By analogy with the analysis of the ↑↓ and ↓↑ layered-antiferromagnetic states in the bilayer, we identify the trilayer ground state as ↑↓↑ or ↓↑↓ at zero field. We conclude that the interlayer coupling in trilayer CrI$_3$ is also antiferromagnetic, and the net magnetization in the ground state, and thus the RMCD value, is ⅓ of the saturated magnetization when the applied field fully aligns the three layers. The jumps in $I_t$ and RMCD in FIGS. 3A and 3B are caused by the magnetization of an individual layer flipping, similar to what is seen in metallic layered-antiferromagnets.

Figure 3C:
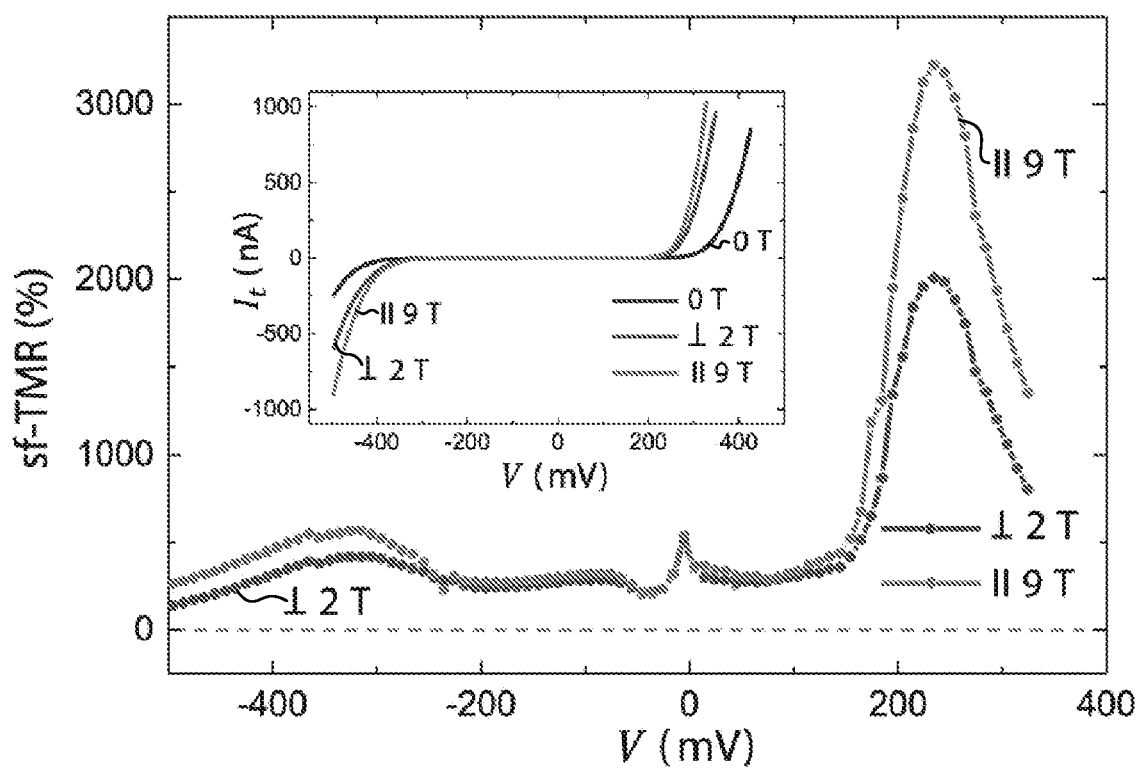

We deduce that the low current plateau at small fields in FIG. 3A occurs because the two layered-antiferromagnetic states (↑↓↑ and ↓↑↓) of the trilayer function as three oppositely polarized spin filters in series. Large enough fields drive the trilayer into fully spin-polarized states, which enhances tunneling and gives the high current plateaus. FIG. 3C shows the sf-TMR as a function of bias derived from the $I_t$-V curves shown in the inset. The peak values are about 2,000% and 3,200% for magnetization fully aligned perpendicular and parallel to the plane, respectively, revealing a drastically enhanced sf-TMR compared to bilayer devices.

Figure 4A:
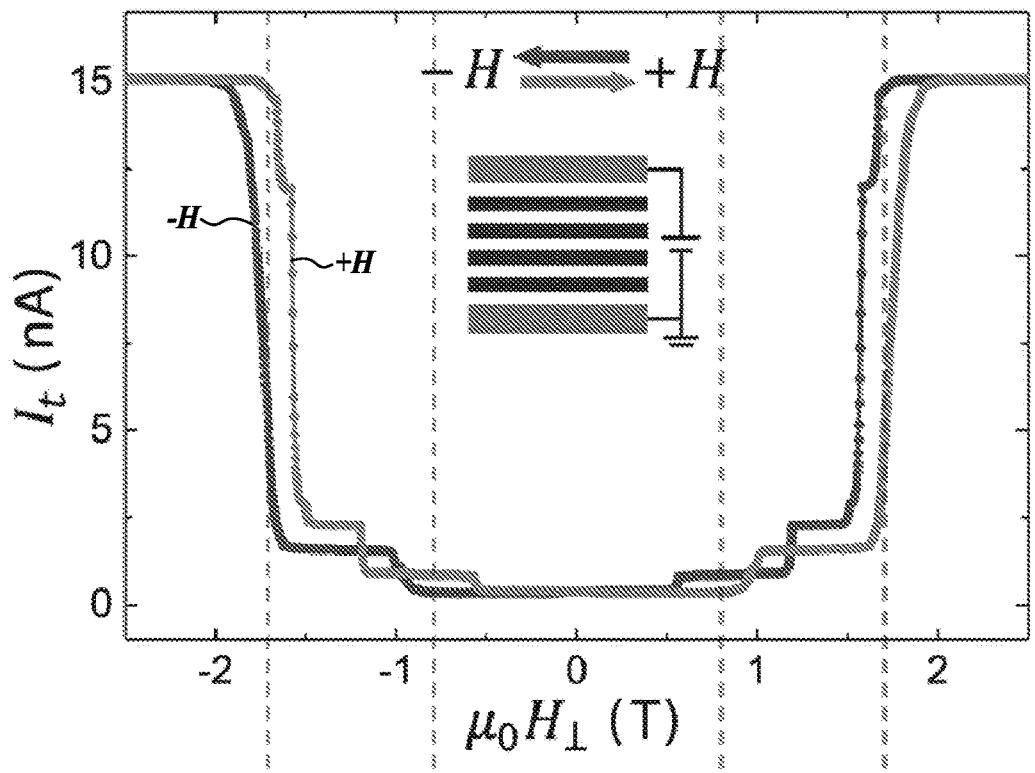
FIGS. 4A-4F. Four-layer $CrI_3$ sf-MTJs with extraordinarily large sf-TMR and multiple resistance states.
Figure 4B:
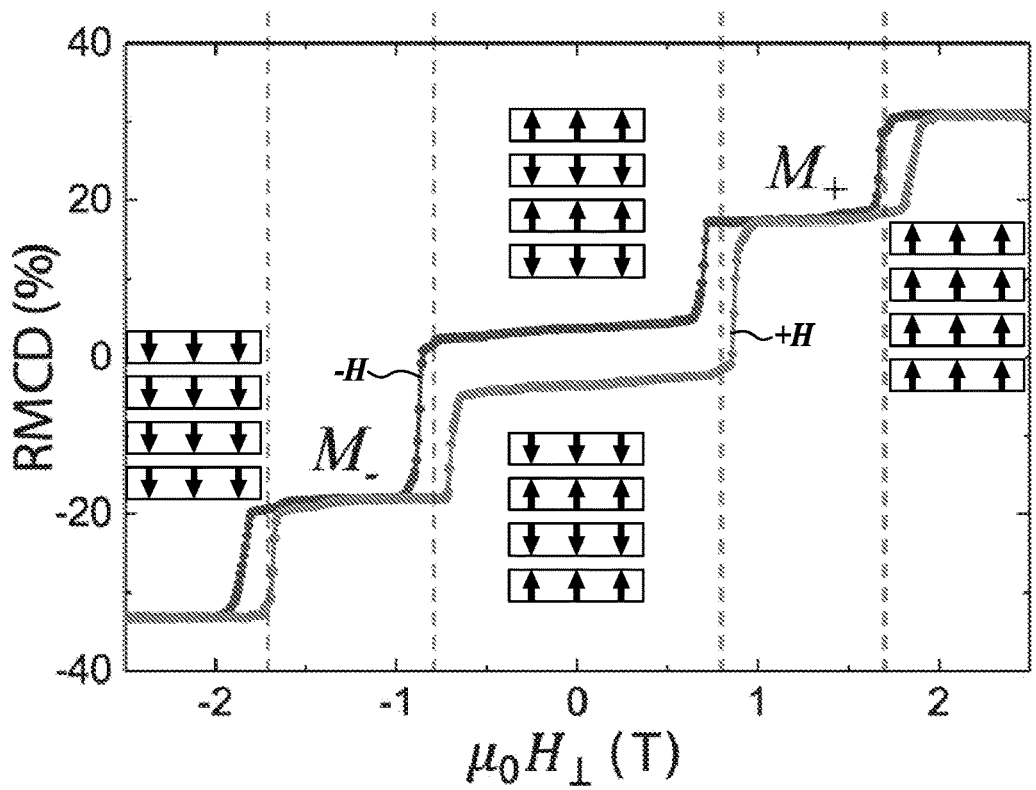
Figure 4C:
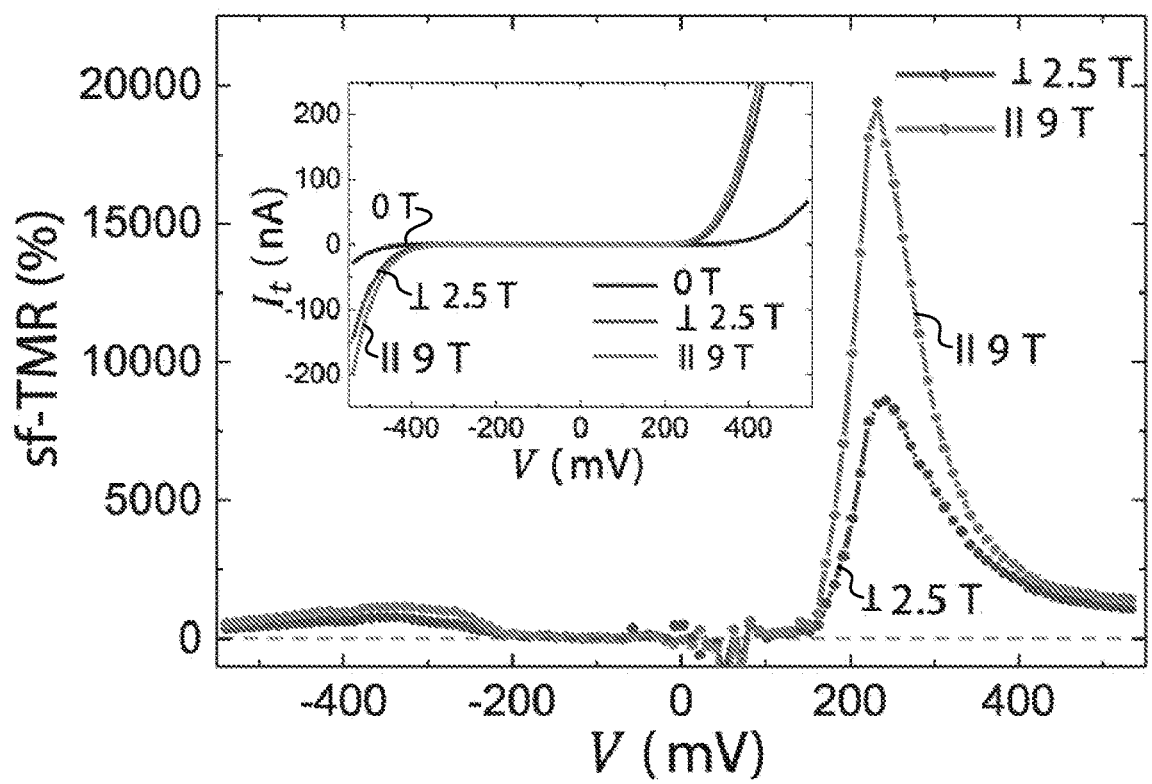

Increasing the CrI$_3$ thickness beyond three layers unlocks more complicated magnetic configurations. FIGS. 4A and B show $I_t$ and RMCD, respectively, for a four-layer device. There are multiple plateaus in each, signifying several magnetic configurations with different effects on the tunneling resistance. The small RMCD signal at low fields, below ~0.8 T, corresponds to the fully antiferromagnetic ground state, either ↑↓↑↓ or ↓↑↓↑. The fact that the RMCD is not zero (FIG. 4B) can be attributed to the asymmetry of the layers caused by the fabrication process, as in the bilayer case above (27). As expected, these fully antiferromagnetic states are very effective at suppressing the tunneling current since they act as four oppositely polarized spin filters in series, explaining the very low current plateau at small fields in FIG. 4A. Applying a large enough field fully aligns the magnetizations of all the layers (↑↑↑↑ or ↓↓↓↓) producing the highest plateaus in both L and RMCD. FIG. 4C shows the sf-TMR as a function of bias extracted from the $I_t$-V curves in the inset. The peak values are now about 8,600% and 19,000% for perpendicular and parallel field, respectively, representing a further enhancement of the sf-TMR compared to bilayer and trilayer cases.

Figure 4D:
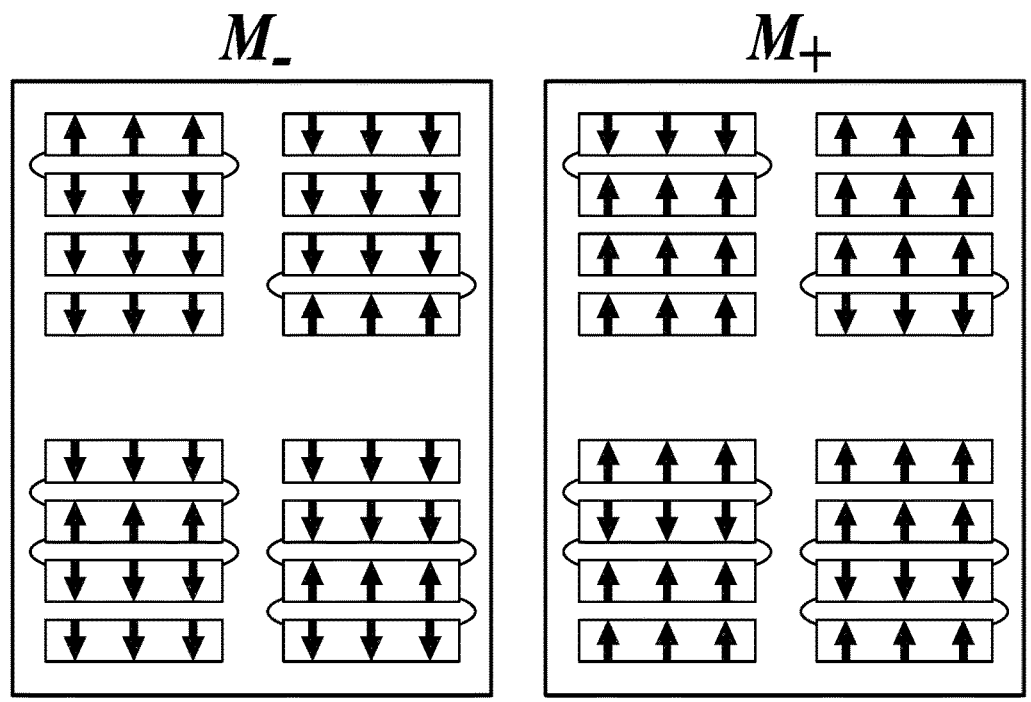

The RMCD of four-layer CrI$_3$ also shows intermediate plateaus at about half the values in the fully aligned states (FIGS. 4B, 4F), corresponding to magnetic states with half the net magnetization of the fully aligned states. There are four possible magnetic states for the positive field plateau: $M_+\{↑↓↑↑,↑↑↓↑,↓↑↑↑,↑↑↑↓\}$, the four time-reversal copies ($M_-$) being the negative field counterparts (FIG. 4D).

The resulting spin filter configuration should then correspond to one layer polarized opposite to the other three.

Remarkably, in the range of fields where these 1:3 configurations occur the tunneling current displays multiple plateaus. The data in FIG. 4A shows three distinct intermediate $I_t$ plateaus. Two are in the positive field corresponding to the same intermediate +18% RMCD plateau, and one is in the negative field range. The curve sweeping in the opposite direction is the time-reversal copy of the first curve. The possibility of lateral domains with different net magnetizations being the cause of these extra plateaus is inconsistent with field-dependent RMCD maps of all three measured four-layer $CrI_3$ sf-MTJs, none of which showed appreciable domains. In addition, the tunnel junction area is quite small compared with the typical domain size of a few microns in $CrI_3$.

Instead, these current plateaus probably originate from distinct magnetic states. Whereas the four states in $M_+$ are indistinguishable in RMCD because of the same net magnetization, the tunneling current is likely to be sensitive to the position of the one layer with minority magnetization. First, the ↓↑↑↑ and ↑↑↑↓ have only one current-blocking interface whereas ↑↓↑↑ and ↑↑↓↑ have two (lines between adjacent layers with opposite magnetizations shown in FIG. 4D). Second, the current flow direction as well as the possibly asymmetric few-layer graphene contacts may introduce distinct sf-TMR either between the ↑↓↑↑ and ↑↑↓↑ states or between the ↓↑↑↑ and ↑↑↑↓ states. This asymmetry may also help to stabilize ↓↑↑↑ and ↑↑↑↓, which in general have higher energy than ↑↓↑↑ and ↑↑↓↑ in fully symmetric four-layer $CrI_3$. However, to identify the specific magnetic states corresponding to the current plateaus will require a means to distinguish the magnetization of individual layers.

Figure 4E:
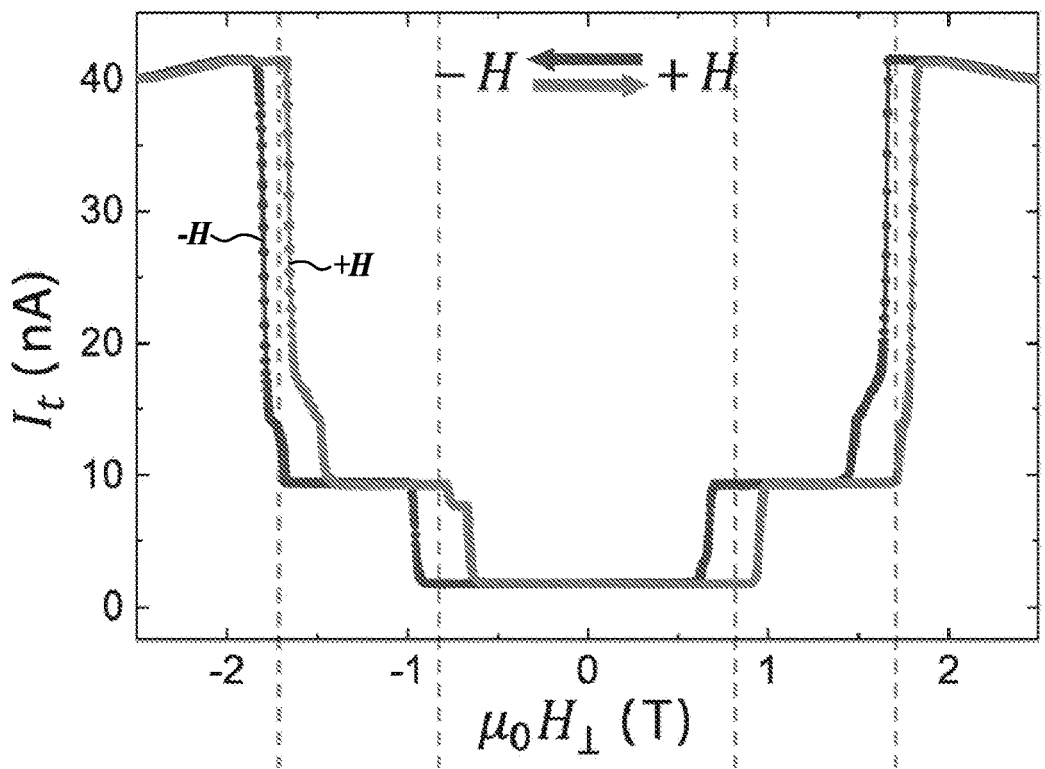
Figure 4F:
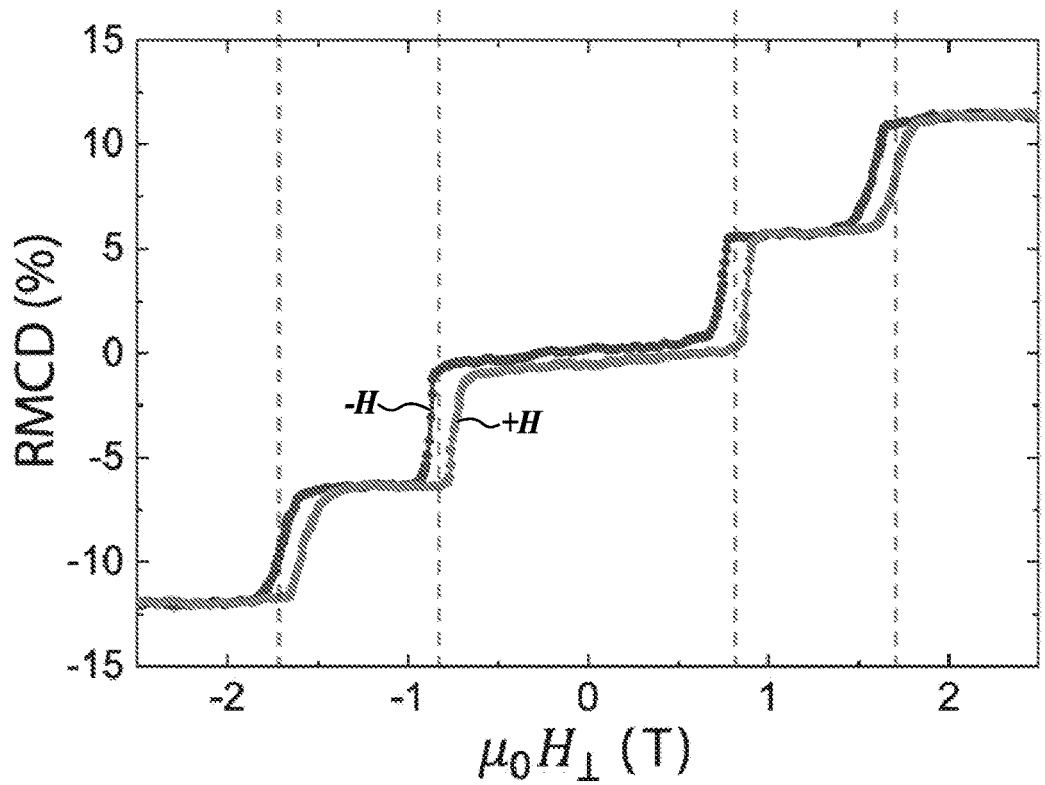

The four-layer $CrI_3$ sf-MTJ points to the potential for using layered antiferromagnets for engineering multiple magnetoresistance states in an individual sf-MTJ. FIGS. 4E and 4F show $I_t$ and RMCD for two other four-layer $CrI_3$ sf-MTJs. They exhibit one or two intermediate plateaus, rather than the three observed in FIG. 4A. The sample dependence suggests that these intermediate states are sensitive to the environment of the $CrI_3$, such as the details of the contacts, implying potential tunability, for example by electrostatically doping the graphene contacts. One exciting future direction could be to seek electrically controlled switching between several different magnetoresistance states. Already the sf-TMR of up to 19,000% observed in four-layer devices is an order of magnitude larger than that of MgO-based conventional MTJs, and several orders of magnitude larger than achieved with existing sf-MTJs under similar experimental conditions. Although the demonstrated vdW sf-MTJs only work at low temperatures, these results highlight the potential of 2D magnets and their heterostructures for engineering novel spintronic devices with unrivaled performance.

Example 2: Fabrication and Testing of Heterostructure Magnetic Tunnel Barriers with Gate Electrodes Electrical manipulation of magnetism is central to spintronics. Voltage-controlled switching between bistable magnetic states can be employed in energy efficient magnetic memory and logic technologies. In this regard, the recently discovered two-dimensional (2D) magnetic insulator chromium triiodide ($CrI_3$) has several assets as a building block for van der Waals (vdW) spintronics. First, the extreme thinness of few-layer $CrI_3$ enhances the probability that the magnetism will be amenable to electrostatic control. Second, the layered antiferromagnetic structure at zero field naturally forms a series of interlayer spin filters, and their relative alignment can be changed by a moderate magnetic field via spin-flip transitions. This unusual property underpins the recent demonstration of multiple-spin-filter magnetic tunnel junctions (sf-MTJs) that exhibit giant tunneling magnetoresistance (TMR).

In multilayer $CrI_3$, for a given net magnetization there are multiple nearly degenerate magnetic states with different patterns of layer magnetization. Switching between these states reconfigures the interlayer spin filters and thus can change the tunneling resistance. If this switching could be induced by voltage alone it would represent a new kind of magnetic logic. We explore this possibility using a sf-MTJ with four-layer $CrI_3$ tunnel barrier between monolayer graphene contacts, as shown schematically in FIG. 5A. This sf-MTJ is sandwiched between two hexagonal boron nitride (hBN) flakes with a graphite top gate (held at voltage $V_{tg}$) and $SiO_2$/Si substrate used as a bottom gate (at voltage $V_{bg}$). The monolayer graphene contacts combine a low density of states with high carrier mobility, allowing much stronger gating effects than using conventional metal electrodes in a vertical junction structure. The tunneling current ($I_t$) is measured while applying a DC bias voltage (V) to the top graphene contact with the bottom one grounded. All measurements described in the main text, except where specified, were made on the device whose optical image is shown in FIG. 5B (device 1), at a temperature of 2 K.

We first use reflective magnetic circular dichroism (RMCD) to probe the net magnetization. FIG. 5C shows the RMCD signal as a function of out-of-plane magnetic field ($\mu_0 H$) swept from negative to positive (orange curve) and vice versa (green curve). It displays typical four-layer $CrI_3$ behavior. At low fields (<0.7 T) the net magnetization nearly vanishes, corresponding to either of the two fully antiferromagnetic states, ↑↓↑↓ or ↓↑↓↑, as indicated in the figure. The arrows here denote the out-of-plane magnetization from top to bottom layer, respectively. The small remnant RMCD signal is caused by a slight asymmetry between the top and bottom layers due to the fabrication process. At high fields (>2 T) the RMCD signal saturates, corresponding to the fully aligned magnetic states, ↑↑↑↑ and ↓↓↓↓. Since the behavior is essentially the same for the opposite field direction, from now on in the discussion we focus on positive magnetic fields.

At intermediate fields (between 0.9 T and 1.7 T) the RMCD signal is about half the saturated value, implying that the net magnetization is half that of the fully aligned state. This is consistent with any of the set of four magnetic states where one layer has the opposite magnetization to the other three, {↑↓↑↑, ↑↑↓↑, ↓↑↑↑, ↑↑↑↓}. Among these, the first two have two antiparallel interfaces while the last two have only one such interface. Since antiparallel interfaces are favored by the antiferromagnetic coupling, the first two should have lower energy. Therefore, we expect the magnetic configuration at intermediate fields to be either ↑↓↑↑ or ↑↑↓↑, these being degenerate and almost indistinguishable if the two internal layers are equivalent.

If a bias is applied either across the junction or between the gates, the RMCD, and thus the net magnetization, does not change, but the electric field can lift the symmetry between ↑↓↑↑ and ↑↑↓↑ and the two states may thus respond differently to the bias, which is expected to yield distinct tunneling magnetoresistance. FIG. 5D shows $I_t$ as a function of $\mu_0 H$ with a bias V=−240 mV on the top graphene and both gates grounded. By comparing with FIG. 5B, we see that the lowest and highest current plateaus correspond to the antiferromagnetic and fully aligned magnetic states, respectively. Interestingly, at intermediate magnetic fields where there is only one plateau in the RMCD signal there are two distinct plateaus in the tunneling current. These must correspond to ↑↓↑↑ and ↑↑↓↑ that is, the current is sensitive to which of the internal layers has the minority magnetization. Modeling the system as a set of coupled magnetic quantum wells, we find that ↑↓↑↑ carries the higher tunneling current than ↑↑↓↑ under these conditions, as the former has a transmission resonance closer to the bias window. We also conclude that the system is bistable, remaining in either one of these two magnetic configurations if the field is kept in the intermediate range.

Now we turn to our key finding, which is that switching between the bistable magnetic states can be controlled and induced by gate voltage, and that this affects the tunneling current. FIGS. 6A-6C show $I_t$ (at V=+80 mV) as the field is swept up and down at three selected pairs of gate voltages. At $V_{tg}$=−2.4 V, $V_{bg}$=0 V (FIG. 6A) we see two intermediate-field plateaus, as in FIG. 5D, implying that ↑↓↑↑ and ↑↑↓↑ are similarly stable. However, at $V_{tg}$=+2.4 V, $V_{bg}$=0 V (FIG. 6B) we see only a higher current plateau, while at $V_{tg}$=−2.4 V, $V_{bg}$=+10 V (FIG. 6C) we see only a lower current plateau. This suggests that the latter gate-voltage pairs cause either ↑↑↓↑ or ↑↓↑↑ to be preferred, respectively.

To confirm this, we first prepare the system in the low-current state at 1.3 T with the gate voltage pair set at the bistable condition of FIG. 6A, indicated by the black open circle in FIG. 6A. We then sweep $V_{tg}$ from −2.4 to +2.4 V, finishing in the gate voltage condition of FIG. 6B. While doing this we monitor the current, which decreases smoothly (inset to FIG. 6B) to the level at the point indicated by the open circle in FIG. 6B. When the magnetic field is subsequently swept down (FIG. 6B) the current jumps to a lower value below 0.7 T, and thereafter repeated cycling between ±2.5 T simply reproduces the prior behavior with a single intermediate plateau. From these observations we infer that if the system is prepared in the state ↑↓↑↑ at $V_{tg}$=−2.4 V, then sweeping $V_{tg}$ with the magnetic field fixed is an adiabatic process that maintains it in this state. However, at $V_{tg}$=+2.4 V this state is only metastable, and it cannot be entered from either fully aligned (highest current) or antiferromagnetic (lowest current) states merely by sweeping the magnetic field.

Remarkably, at larger bias voltages it is possible to induce reversible switching between the two magnetic states purely by gate voltage control, while staying at a single fixed magnetic field. FIGS. 7A and 7C show the current at V=−240 mV vs magnetic field at $V_{tg}$=−2.4 V and +2.4 V, respectively, both at $V_{bg}$=0 V. The inferred magnetic states are indicated by insets; note that the state that carries the higher current at this negative bias is the one that carried the lower current at the positive bias V=+80 mV (see FIG. 6A). This is self-consistent with bistable states assignment, since the reversal of current flow direction accompanies the reversal of the relative magnitude of $I_t$ between the bistable magnetic states.

If we now fix $\mu_0$H=1 T and sweep $V_{tg}$ up and down between −2.4 V and +2.4 V (FIG. 7B), the current changes repeatably between end values corresponding to ↑↓↑↑ and ↑↑↓↑ (determined from FIGS. 7A and 7C), implying that reproducible switching between these states occurs. Meanwhile, the RMCD signal is almost constant (bottom panel, FIG. 7B), as expected since the two states have the same net magnetization. The general changes in the current with increasing magnitude of $V_{tg}$ is probably associated with doping of the graphene contacts causing a different mismatch of spin or momentum between the contacts. Most interestingly, at intermediate $V_{tg}$ there is pronounced hysteresis in the current, just as expected for a transition between two metastable states, accompanied by small wiggles that are naturally explained by associated domain effects. Within this hysteretic region the current differs between the two states by as much as a factor of ten.

The influence of the gate voltages on the magnetic states can be in principle due to modifications of the anisotropy and interlayer coupling through changes in orbital occupancy and/or electric-field effects modifying the energy splitting of ↑↓↑↑ and ↑↑↓↑. Monte Carlo simulations reveal that changing anisotropy alone is not sufficient, and changing interlayer coupling must be included to reproduce the experimental observation.

Finally, we show that direct and dramatic gate-voltage control of the TMR is possible in such devices, irrespective of the switching effect described above. As usual, we define the TMR ratio by 100%×($R_{ap}$−$R_p$)/$R_p$, where $R_{ap}$ and $R_p$ are the DC resistances with fully anti-parallel (antiferromagnetic, low-field) and parallel (fully spin-polarized, high-field) layer magnetization measured at a given bias. FIG. 8A shows the TMR as a function of bias for device 2 (which has a single bottom gate), derived from $I_t$-V curves as shown in the inset for both in-plane and out-of-plane magnetic field at $V_{bg}$=0 V. The behavior is similar to that reported previously for ungated devices. The TMR is substantially modified by back gate voltage. FIG. 8B shows $I_t$-V curves for layered-antiferromagnetic states (dashed curves, $\mu_0$H=0 T) and fully aligned states (solid curves, $\mu_0$H=3 T), at $V_{bg}$ values between −30 V and +30 V. There is a consistent shift of the thresholds in these curves towards positive bias as $V_{bg}$ becomes more positive. FIG. 8C shows the derived TMR ratio. Its peak value varies from 57,000% to 17,000%. The origin of this behavior is under investigation and beyond the scope of this disclosure, but it may involve a combination of electric field modification of the spin-dependent tunnel barrier, changes of Fermi level and magnetic proximity effects induced by $CrI_3$ in the monolayer graphene contacts.

Methods:

Device Fabrication $CrI_3$ crystals were mechanically exfoliated onto 90 nm $SiO_2$/Si substrates in a nitrogen glove box with water and oxygen concentration less than 0.5 ppm. The four-layer $CrI_3$ flakes were identified by their optical contrast relative to the substrate using the established optical contrast models of $CrI_3$. The monolayer graphene, graphite and 5-30 nm hBN flakes were exfoliated onto either 285 nm or 90 nm $SiO_2$/Si substrates and examined by optical and atomic force microscopy under ambient conditions. Only atomically clean and smooth flakes were identified and used. Metallic V/Au (7/70 nm) electrodes were deposited onto the bottom hBN flakes and substrates using electron beam evaporation before a standard electron beam lithography with a bilayer resist (A4 495 and A4 950 poly (methyl methacrylate (PMMA))). The van der Waals stacking was performed in the glove box using a polymer-based dry transfer technique. The flakes were picked up sequentially: top gate graphite, top hBN, top monolayer graphene contact, four-layer $CrI_3$, bottom monolayer graphene contact. The resulting stacks were then transferred and released on top of the bottom hBN with pre-patterned electrodes. In the complete heterostructure, the $CrI_3$ flake is fully encapsulated, and the top/bottom monolayer graphene and the top gate graphite flakes are connected to the pre-patterned electrodes.

Electrical Measurement

The electrical measurements were performed in a PPMS DynaCool cryostat (Quantum Design, Inc.) with a base temperature of 1.7 K. The four-layer $CrI_3$ sf-MTJ devices were mounted in a Horizontal Rotator probe, which allows applying out-of-plane or in-plane magnetic field up to 9 T. FIG. 5A shows the schematic of four-layer $CrI_3$ sf-MTJs. The DC bias voltage (V) is applied to the top monolayer graphene contact with the bottom monolayer graphene contact grounded. The top and bottom gate voltages ($V_{tg}$ and $V_{bg}$) are applied to the top gate graphite and bottom doped Si substrate, respectively. The resulting tunneling current ($I_t$) is amplified and measured by a current preamplifier (DL Instruments; Model 1211).

Reflective Magnetic Circular Dichroism Measurement

The reflective magnetic circular dichroism (RMCD) measurements were performed in an attocube closed-cycle cryostat (attoDRY 2100) with a base temperature of 1.55 K and up to 9 T magnetic field in the out-of-plane direction. A power-stabilized 632.8 nm HeNe laser was used to probe the device at normal incidence with a fixed power of 1 μW. The AC lock-in measurement technique used to measure the RMCD signal follows closely to the previous magneto-optical Kerr effect (MOKE) and RMCD measurements of the magnetic order in atomically-thin $CrI_3$.

Any approximate terms, such as "about," "approximately," and "substantially," indicate that the subject can be modified by plus or minus 5% and fall within the described embodiment.

While illustrative embodiments have been illustrated and described, it will be appreciated that various changes can be made therein without departing from the spirit and scope of the invention.

The ebodiments of the invention in which an exclusive property or privilege is claimed are defined as follows:

1. A system for controlling electric current across a magnetic tunnel junction, the system comprising a layered heterostructure that includes:
    a magnetic tunnel barrier comprising a layered magnet structure having a plurality of magnetic layers, including a first magnetic layer with a first magnetic vector and a second magnetic layer with a second magnetic vector that is opposite to the first magnetic vector, wherein both the first magnetic layer and the second magnetic layer comprise crystalline chromium triiodide having a unit-cell formula $CrI_3$;
    a first electrode that is not magnetic and is electrically connected to the first magnetic layer; and
    a second electrode that is not magnetic and is electrically connected to the second magnetic layer;
    wherein the magnetic tunnel barrier permits significantly larger tunneling current to tunnel from the first electrode to the second electrode only when the first magnetic vector and the second magnetic vector are aligned.

2. The system of claim 1, wherein the first magnetic layer and the second magnetic layer of the layered heterostructure are bonded together by van der Waals forces.

3. The system of claim 1, wherein the layered heterostructure further includes at least one additional magnetic layer, which is bonded by van der Waals forces.

4. The system of claim 3, wherein the layered heterostructure has a total of three or four magnetic layers, and a magnetic spin vector of each magnetic layer is opposite its adjacent layers at ground state.

5. The system of claim 1, wherein the layered heterostructure exhibits multiple intermediate tunneling magnetoresistance states in proportion to the number of magnetic layers.

6. The system of claim 1, wherein the layered heterostructure is characterized by a tunneling magnetoresistance in the range of 310% to 57,000%.

7. The system of claim 1, wherein the first electrode or the second electrode, or both, comprise graphene or graphite.

8. The system of claim 1, further comprising a magnet configured to apply a magnetic field to the layered heterostructure sufficient to modulate the magnetizations of the magnetic layers.

9. The system of claim 8, wherein the magnet is configured to apply a magnetic field normal to an in-plane direction of the layered heterostructure.

10. The system of claim 8, wherein the magnet is configured to apply a magnetic field parallel to an in-plane direction of the layered heterostructure.

11. The system of claim 8, wherein the external applied magnetic field is characterized by a field strength in the range of 0 to 9 Tesla.

12. The system of claim 1, further comprising a temperature control system configured to cool the system below a critical temperature of the crystalline chromium triiodide.

13. The system of claim 1, further comprising a voltage source electrically coupled to the first electrode and the second electrode, and configured to apply an electric field to the layered heterostructure sufficient to modify the magnetizations of the magnetic layers.

14. A method of controlling an electric current across a magnetic tunnel barrier in a system according to claim 1, the layered heterostructure of the magnetic tunnel barrier having a characteristic magnetic structure, the method comprising:
    applying a voltage to the layered heterostructure of the magnetic tunnel barrier, between the first electrode and the second electrode;
    applying a magnetic field to the layered heterostructure; and
    modulating the magnetic field to control an electric current flowing from the first electrode to the second electrode.

15. The method of claim 14, further comprising cooling the layered heterostructure to a temperature below the critical temperature of the crystalline chromium triiodide.

16. The method of claim 14, further comprising aligning the magnetic field either normal to or parallel to the in-plane direction of the layered heterostructure.

17. The method of claim 14, further comprising modulating the voltage to control the electric current flowing between the first electrode and the second electrode.

18. The method of claim 14, further comprising repeatedly modulating the magnetic field to toggle the layered heterostructure between a relatively insulating state and a conducting state.

19. The method of claim 18, wherein the layered heterostructure exhibits multiple intermediate magnetic states, and wherein the method further comprises modulating the magnetic field and applied voltage to select for one of the multiple intermediate magnetic states.

20. The method of claim 14, wherein applying the magnetic field to the layered heterostructure comprises applying a magnetic field in the range of 0.1 to 9 Tesla.

* * * * *